(12) United States Patent
Kim et al.

(10) Patent No.: US 12,414,444 B2
(45) Date of Patent: Sep. 9, 2025

(54) DISPLAY DEVICE HAVING A PATTERN DISPOSED AROUND A HOLE

(71) Applicant: Samsung Display Co., Ltd., Yongin-Si (KR)

(72) Inventors: Youngmin Kim, Seoul (KR); Jae Kyung Go, Yongin-si (KR); Yongseung Park, Gyeonggi-do (KR); Jawoon Lee, Seoul (KR); Minjun Jo, Cheonan-si (KR); Young Seo Choi, Yongin-si (KR); Haeri Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 17/394,493

(22) Filed: Aug. 5, 2021

(65) Prior Publication Data

US 2022/0085121 A1    Mar. 17, 2022

(30) Foreign Application Priority Data

Sep. 11, 2020   (KR) .................. 10-2020-0116567

(51) Int. Cl.
| | | |
|---|---|---|
| *H01L 27/32* | (2006.01) | |
| *H10K 59/122* | (2023.01) | |
| *H10K 59/65* | (2023.01) | |
| *H10K 59/80* | (2023.01) | |

(52) U.S. Cl.
CPC .......... *H10K 59/122* (2023.02); *H10K 59/65* (2023.02); *H10K 59/873* (2023.02)

(58) Field of Classification Search
CPC .................. H10K 59/122; H10K 59/65
See application file for complete search history.

(56) References Cited

U.S. PATENT DOCUMENTS

| | | |
|---|---|---|
| 9,634,035 B2 | 4/2017 | An et al. |
| 10,437,113 B2 | 10/2019 | Lee et al. |
| 11,050,041 B2 | 6/2021 | Choi et al. |
| 12,010,866 B2 | 6/2024 | Lee et al. |
| 2012/0007137 A1* | 1/2012 | Lee .................. H10K 50/8426 438/26 |
| 2017/0294491 A1* | 10/2017 | Jo ...................... H10K 59/131 |
| 2019/0252475 A1* | 8/2019 | Sung ..................... H04N 23/57 |
| 2019/0278132 A1 | 9/2019 | Nakamura et al. |
| 2020/0113069 A1 | 4/2020 | Her et al. |

(Continued)

FOREIGN PATENT DOCUMENTS

| | | | | |
|---|---|---|---|---|
| CN | 111900186 A | * | 11/2020 | ............ H10K 50/11 |
| KR | 10-2016-0090968 | | 8/2016 | |

(Continued)

*Primary Examiner* — Peter Bradford
(74) *Attorney, Agent, or Firm* — F. CHAU & ASSOCIATES, LLC

(57) ABSTRACT

A display device including: a display panel including a base layer, a circuit layer, a light emitting element layer, and a hole, wherein the hole passes through the circuit layer and the light emitting element layer; a compensation layer disposed on the light emitting element layer and overlapping the hole; and a division pattern disposed around the hole when viewed in a plane and including a first division pattern, a second division pattern, and a third division pattern, which are sequentially arranged and spaced apart from each other.

14 Claims, 23 Drawing Sheets

(56) References Cited

U.S. PATENT DOCUMENTS

| | | | |
|---|---|---|---|
| 2020/0303472 A1* | 9/2020 | Lou | H10K 59/131 |
| 2020/0373519 A1* | 11/2020 | Wang | H10K 50/852 |
| 2021/0210713 A1* | 7/2021 | Li | H10K 59/131 |
| 2021/0408166 A1* | 12/2021 | Yang | H10K 50/844 |
| 2022/0190049 A1* | 6/2022 | Sun | H10K 50/813 |

FOREIGN PATENT DOCUMENTS

| | | |
|---|---|---|
| KR | 10-2017-0031837 | 3/2017 |
| KR | 10-2020-0003334 A | 1/2020 |
| KR | 10-2020-0039422 | 4/2020 |
| KR | 10-2020-0051075 A | 5/2020 |
| KR | 10-2020-0085638 A | 7/2020 |

\* cited by examiner

DISPLAY DEVICE HAVING A PATTERN DISPOSED AROUND A HOLE

CROSS-REFERENCE TO RELATED APPLICATION

This U.S. non-provisional patent application claims priority under 35 U.S.C. § 119 to Korean Patent Application No. 10-2020-0116567, filed on Sep. 11, 2020, the disclosure of which is incorporated by reference herein in its entirety.

1. TECHNICAL FIELD

The present disclosure relates to a display device. More particularly, the present disclosure relates to a display device including a signal passing region through which an optical signal moves.

2. DESCRIPTION OF THE RELATED ART

In recent years, portable electronic apparatuses such as smartphones are becoming widespread, and their functions are becoming increasingly diversified. Electronic apparatuses with a wider display area and a narrower non-display area are now preferred in comparison to electronic apparatuses with large non-display areas.

Accordingly, various types of electronic apparatuses are being developed to reduce an area of the non-display area.

SUMMARY

An embodiment of the inventive concept provides a display device including: a display panel comprising a base layer, a circuit layer, a light emitting element layer, and a hole, wherein the hole passes through the circuit layer and the light emitting element layer; a compensation layer disposed on the light emitting element layer and overlapping the hole; and a division pattern disposed around the hole when viewed in a plane and including a first division pattern, a second division pattern, and a third division pattern, which are sequentially arranged and spaced apart from each other.

A distance between the first division pattern and the second division pattern may be substantially the same as a distance between the second division pattern and the third division pattern.

The division pattern may be disposed on the base layer.

The light emitting element layer may include: a pixel definition layer disposed on the circuit layer; a first electrode exposed through the pixel definition layer; a light emitting layer disposed on the first electrode; and a second electrode disposed on the light emitting layer, wherein the division pattern comprises a same material as the pixel definition layer.

The division pattern may include a plurality of layers.

A first length from a center of the hole to the first division pattern, a second length from the center of the hole to the second division pattern, and a third length from the center of the hole to the third division pattern may be substantially the same as each other.

At least one of a first length from a center of the hole to the first division pattern, a second length from the center of the hole to the second division pattern, and a third length from the center of the hole to the third division pattern may be different from another of the first to third lengths.

The display device may further include a dam surrounding the hole and disposed on the base layer.

A distance from the division pattern to a center of the hole may be less than a distance from the dam to the center of the hole.

The dam may include a plurality of layers.

The dam may have a height greater than a height of the division pattern.

The division pattern may further include: a primary division pattern disposed adjacent to the hole; and a secondary division pattern disposed between the primary division pattern and the dam, wherein the secondary division pattern includes a fourth division pattern, a fifth division pattern, and a sixth division pattern, which are arranged around the hole and spaced apart from each other.

A distance between the fourth division pattern and the fifth division pattern may be substantially the same as a distance between the fifth division pattern and the sixth division pattern.

The display panel may include an active area for displaying an image and a non-active area adjacent to the active area, wherein the hole is surrounded by the active area.

An embodiment of the inventive concept provides a display device including: a display panel including a first area including a hole, a second area surrounding the first area and overlapping a circuit layer, and a third area surrounding the second area and overlapping a light emitting element disposed on the circuit layer; a compensation layer disposed on the display panel and overlapping the first area; and a division pattern disposed around the first area and in the second area, wherein the division pattern includes a first division pattern, a second division pattern, and a third division pattern, which are sequentially arranged and spaced apart from each other.

A distance between the first division pattern and the second division pattern may be substantially the same as a distance between the second division pattern and the third division pattern.

The display device may further include a camera module disposed under the display panel and overlapping the first area.

The compensation layer may overlap at least a portion of the second area and not overlap the third area.

The display device may further include a dam overlapping the first area, wherein the division pattern is closer to the first area than the dam is.

The division pattern may include a conductive layer.

An embodiment of the inventive concept provides a display device including: a display panel including a light emitting element; a hole that is provided in the display panel and does not overlap the light emitting element; and a division pattern that is disposed around the hole and does not overlap the light emitting element, wherein the division pattern includes a first division pattern, a second division pattern, and a third division pattern, which are sequentially arranged and spaced apart from each other, and a distance between the first division pattern and the second division pattern is substantially the same as a distance between the second division pattern and the third division pattern.

The display device may further include a dam surrounding the division pattern.

The division pattern may be disposed between the dam and the hole.

A height of the dam may be different from a height of the division pattern.

The display device may further include a compensation layer filling the hole and filling at least a portion of an area between the dam and the division pattern.

An embodiment of the inventive concept provides a display device including: a display panel including a light emitting element; a hole formed in the display panel, the hole spaced apart from the light emitting element; a division pattern disposed between the hole and the light emitting element, wherein the division pattern includes a plurality of openings having substantially the same size; and a compensation layer overlapping the hole and the division pattern.

The display device may further include a dam disposed between the light emitting element and the division pattern.

The compensation layer may contact the dam.

The compensation layer may not contact the light emitting layer.

The display device may further include an electronic optical module disposed in the hole.

BRIEF DESCRIPTION OF THE DRAWINGS

The above and other features of the present disclosure will become readily apparent by reference to the following detailed description when considered in conjunction with the accompanying drawings wherein.

DETAILED DESCRIPTION OF THE EMBODIMENTS

Figure 1:
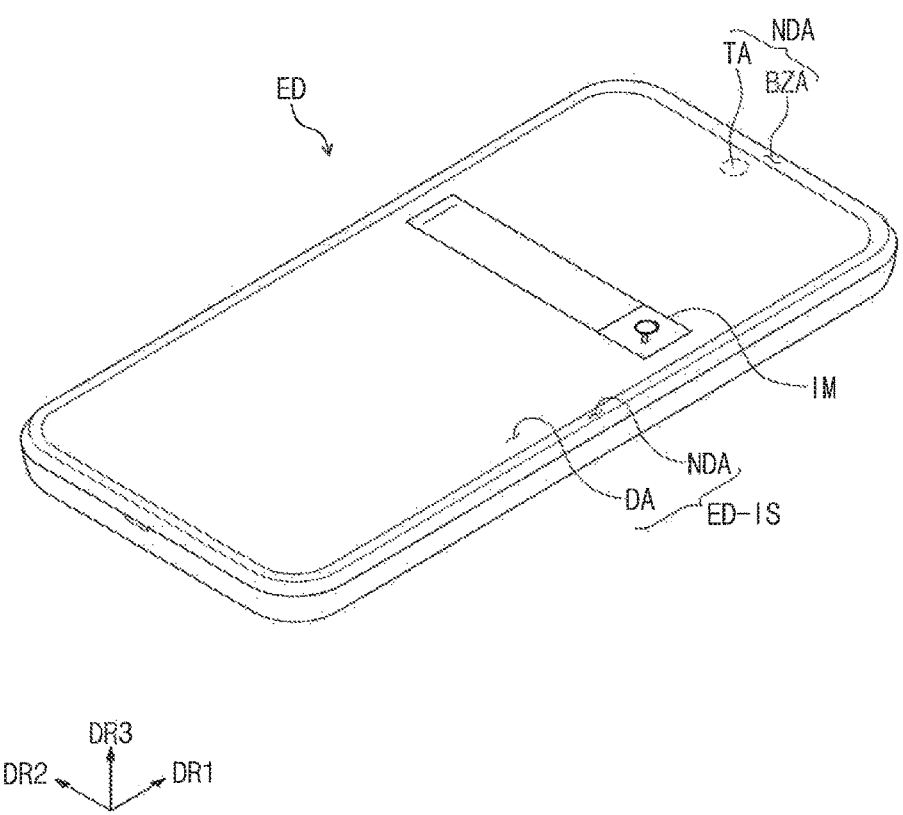
FIG. 1 is an assembled perspective view showing an electronic apparatus according to an embodiment of the present disclosure.

Like numerals may refer to like elements throughout. In the drawings, the thickness, ratio, and dimension of components may be exaggerated.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein to describe one element or feature's relationship to another element(s) or feature(s) as illustrated in the figures.

Figure 2:
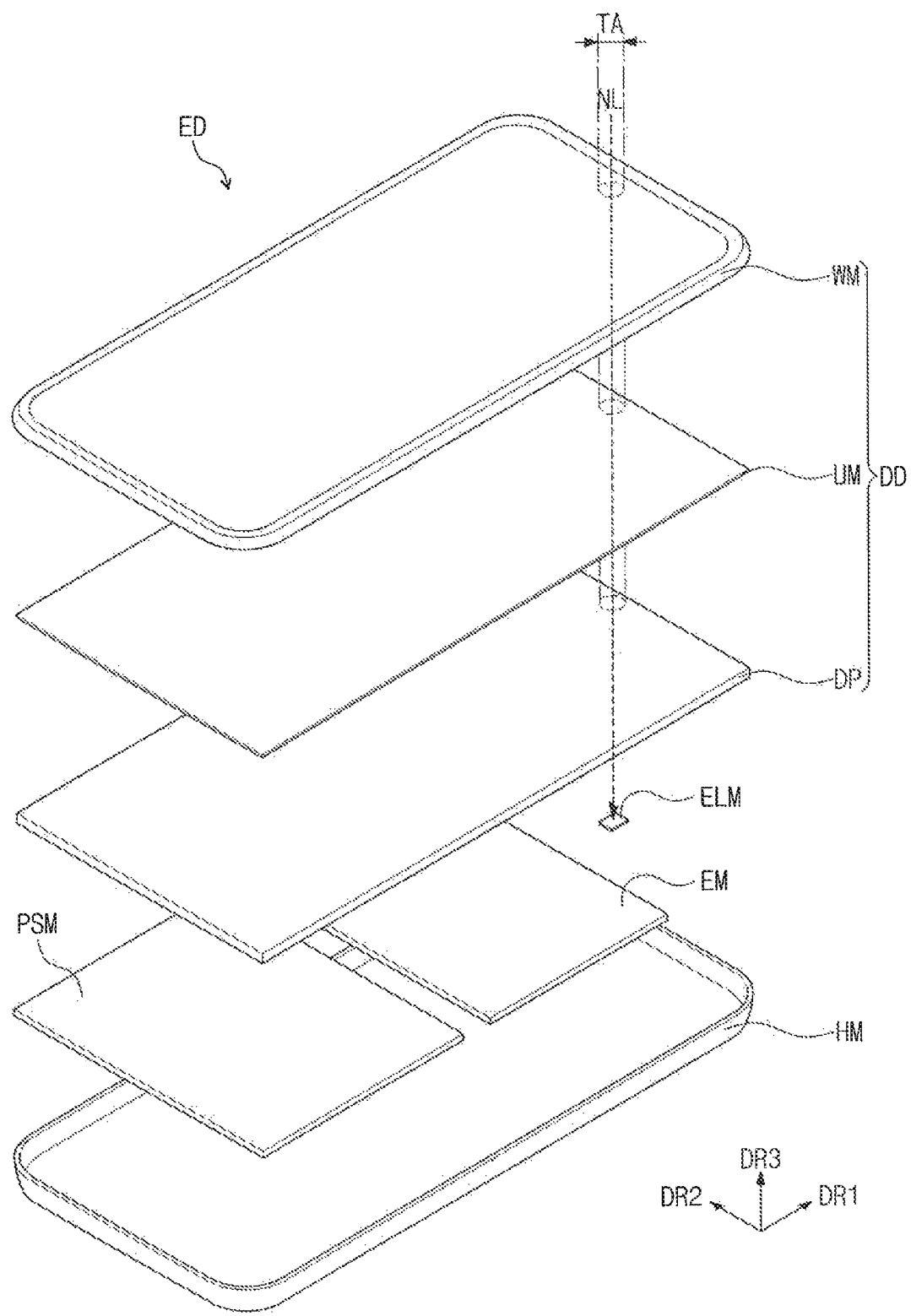
FIG. 2 is an exploded perspective view showing an electronic apparatus according to an embodiment of the present disclosure.
Figure 3:
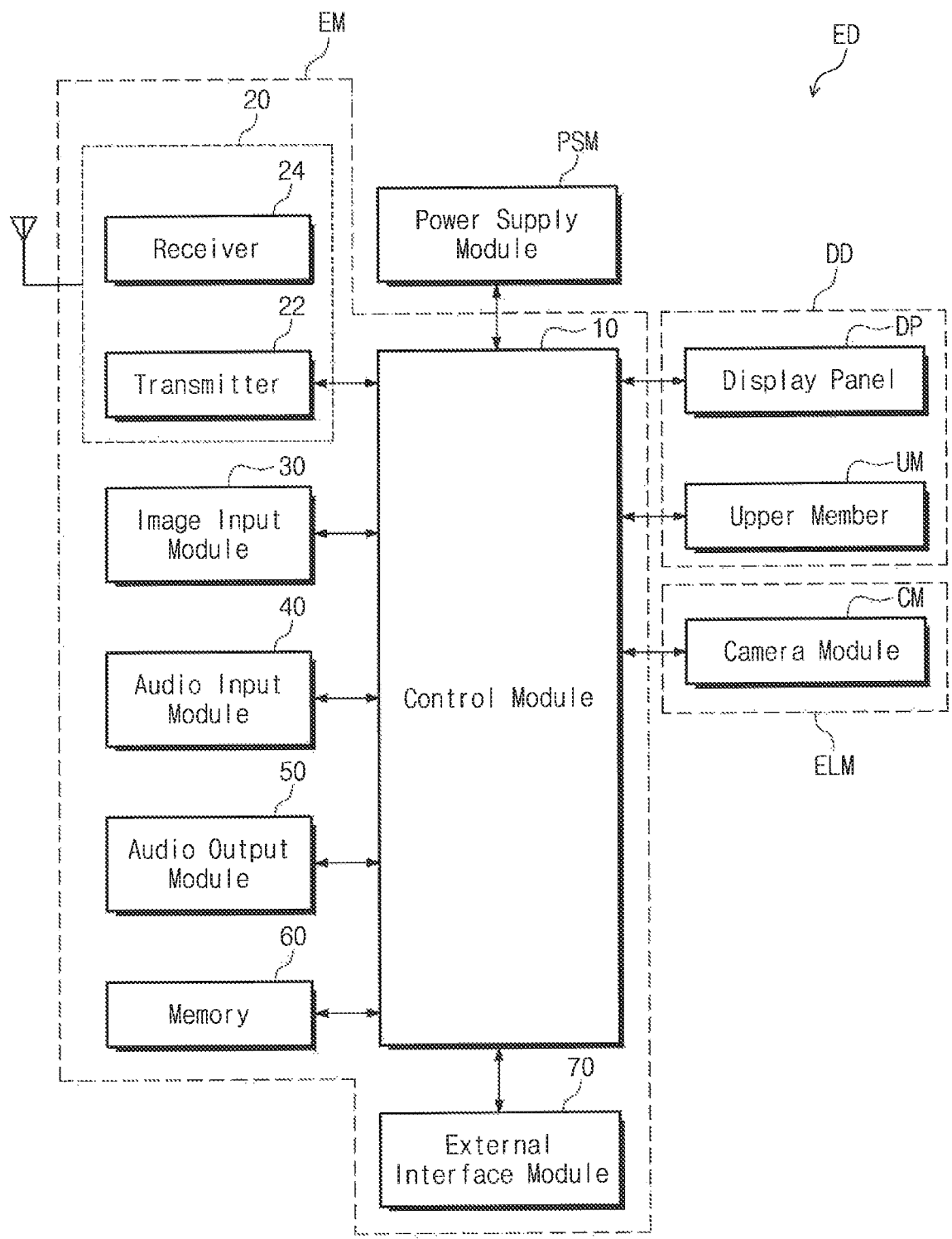
FIG. 3 is a block diagram showing an electronic apparatus according to an embodiment of the present disclosure.

FIG. 1 is an assembled perspective view showing an electronic apparatus ED according to an embodiment of the present disclosure. FIG. 2 is an exploded perspective view showing the electronic apparatus ED according to an embodiment of the present disclosure. FIG. 3 is a block diagram showing the electronic apparatus ED according to an embodiment of the present disclosure.

Referring to FIG. 1, the electronic apparatus ED may display an image IM through a display surface ED-IS. The display surface ED-IS may be substantially parallel to a plane formed by a first direction DR1 and a second direction DR2. A third direction DR3 indicates a normal line direction of the display surface ED-IS, e.g., a thickness direction of the electronic apparatus ED. The display surface ED-IS of the electronic apparatus ED may correspond to a front surface of the electronic apparatus ED and may correspond to an upper surface of a window WM.

Hereinafter, front (or upper) and rear (or lower) surfaces of each member or each unit may be distinguished from each other by the third direction DR3. However, the first to third directions DR1, DR2, and DR3 are merely examples.

The display surface ED-IS may include a display area DA and a non-display area NDA adjacent to the display area DA. The non-display area NDA may be an area through which images are not displayed. The non-display area NDA may include a first non-display area BZA and a second non-display area TA.

The first non-display area BZA may be an area that blocks an optical signal and may be disposed outside the display area DA to surround the display area DA. According to an embodiment, the first non-display area BZA may be provided in a side surface of the electronic apparatus ED rather than the front surface of the electronic apparatus ED. According to another embodiment, the first non-display area BZA may be omitted.

In the present embodiment, the first non-display area BZA surrounds the display area DA, however, it should not be limited thereto or thereby. The first non-display area BZA may be disposed at only one side of the display area DA. The first non-display area BZA may be disposed only in areas facing each other in the first direction DR1.

The second non-display area TA may be an area that transmits the optical signal. As an example, one second non-display area TA is shown, however, more second non-display areas may be provided. In the present embodiment, the optical signal may be a natural light from the outside or an infrared ray generated by a light emitting element.

In an embodiment of the present disclosure, a portion of the second non-display area TA may extend from the first non-display area BZA.

In the present embodiment, the display surface ED-IS is shown as being flat, however, according to another embodiment, curved areas may be provided at opposite sides of the display surface ED-IS, which face each other in the second direction DR2.

In the present embodiment, a mobile phone is shown as a representative example, however, the electronic apparatus ED according to the present disclosure should not be limited to the mobile phone and may be applied to various information providing devices, such as a television set, a navigation unit, a computer monitor, a game unit, or the like.

Referring to FIGS. 2 and 3, the electronic apparatus ED may include a display device DD, an electronic module EM, an electronic optical module ELM, a power supply module PSM, and a housing HM.

The display device DD generates the images. The display device DD includes a display panel DP, an upper member UM, and the window WM. Areas corresponding to the display area DA, the first non-display area BZA, and the second non-display area TA of the electronic apparatus ED are provided in the display device DD.

The display panel DP should not be particularly limited. For example, the display panel DP may be a light emitting type display panel, such as an organic light emitting display panel or a quantum dot light emitting display panel.

According to configurations of the upper member UM, the display device DD may sense an external input and/or an external pressure. The upper member UM may include a variety of members.

In the present embodiment, the upper member UM may include an optical film and an input sensor. The optical film may reduce a reflectance of the external light. The input sensor may sense an external input by a user. The input sensor may include an input sensing panel. The upper member UM may further include an adhesive layer attaching the optical film to the input sensor.

The optical film may include a polarizer and a retarder. The polarizer may be a stretched-type or coated-type polarizer, and the retarder may be a stretched-type or coated-type retarder. The input sensor may sense the external input by a capacitance method, a pressure sensing method, or an electromagnetic induction method.

The window WM may form an exterior of the electronic apparatus ED. The window WM may include a base substrate and may further include functional layers, such as an anti-reflective layer, an anti-fingerprint layer, etc.

The display device DD may further include at least one adhesive layer. The adhesive layer may attach the window WM to the upper member UM or may attach the upper member UM to the display panel DP. The adhesive layer may be an optically transparent adhesive layer or a pressure sensitive adhesive layer.

The electronic module EM may include a control module 10, a wireless communication module 20, an image input module 30, an audio input module 40, an audio output module 50, a memory 60, and an external interface module 70. The modules disclosed herein may be mounted on a circuit board or may be electrically connected to the circuit board through a flexible circuit board. The electronic module EM may be electrically connected to the power supply module PSM.

The control module 10 may control an overall operation of the electronic apparatus ED. For example, the control module 10 may activate or deactivate the display device DD in response to the user's input. The control module 10 may control other modules, such as the image input module 30, the audio input module 40, the audio output module 50, or the like, in response to the user's input. The control module 10 may include at least one microprocessor.

The wireless communication module 20 may transmit/receive a wireless signal to/from other terminals using a Bluetooth or WiFi link. The wireless communication module 20 may transmit/receive a voice signal using a general communication line. The wireless communication module 20 may include a transmitter 22 that modulates a signal to be transmitted and transmits the modulated signal and a receiver 24 that demodulates the signal applied thereto.

The image input module 30 may process an image signal and may convert the image signal into image data that may be displayed through the display device DD. The audio input module 40 may receive an external sound signal through a microphone in a record mode or a voice recognition mode and may convert the external sound signal to electrical voice data. The audio output module 50 may convert sound data provided thereto from the wireless communication module 20 or sound data stored in the memory 60 and may output the converted sound data.

The external interface module 70 may be an interface between the control module 10 and external devices, such as an external charger, a wired/wireless data port, a card socket (e.g., a memory card and a subscriber identification module (SIM)/user identity module (UIM) card), etc.

The power supply module PSM may supply a power required for the overall operation of the electronic apparatus ED. The power supply module PSM may include a battery device.

The housing HM shown in FIG. 2 is coupled to the display device DD, particularly, the window WM, to accommodate other modules. In FIG. 2, the housing HM formed in a single unit is shown as a representative example. However, the housing HM may include two or more components assembled to each other.

The electronic optical module ELM may be an electronic component that outputs or receives the optical signal. The electronic optical module ELM may transmit or receive the optical signal through a partial area of the display device DD corresponding to the second non-display area TA. In the present embodiment, the electronic optical module ELM may include a camera module CM. The camera module CM may receive a natural light signal NL (refer to FIG. 2) through the second non-display area TA (refer to FIG. 2) to take an image of an external object. The natural light signal NL may pass through an opening formed in the window WM, the upper member UM and the display panel DP. The electronic optical module ELM may include a proximity sensor or an ultraviolet light sensor.

The electronic optical module ELM is disposed under the display device DD. The electronic optical module ELM overlaps the second non-display area TA of the display device DD. The second non-display area TA of the display device DD has a light transmittance higher than other areas of the display device DD. Hereinafter, the display device DD will be described in detail.

Figure 4A:
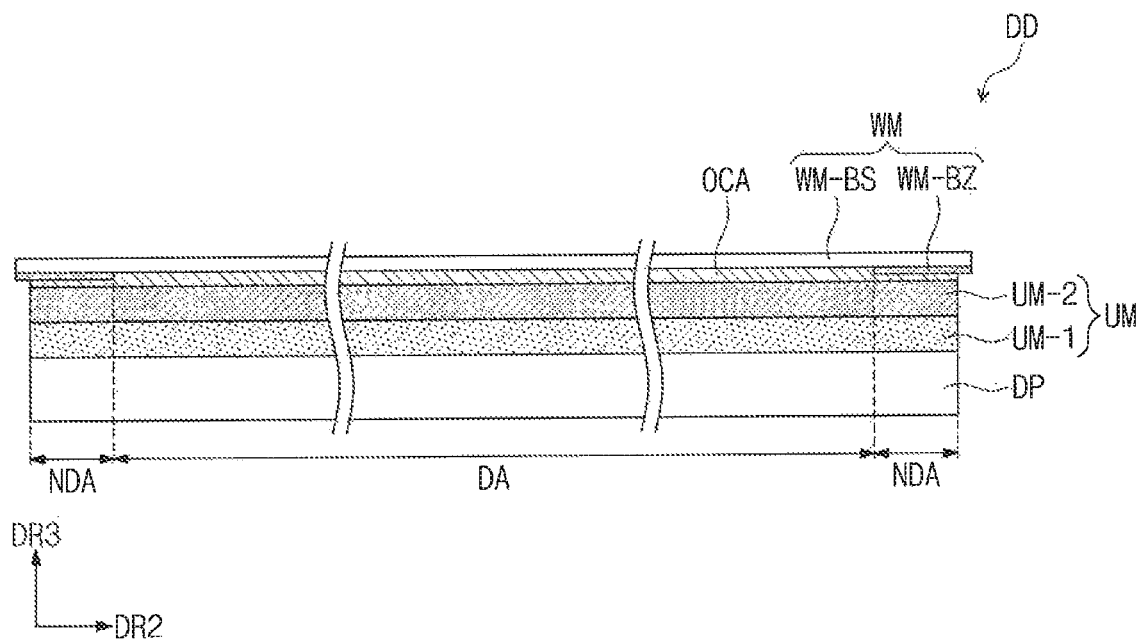
FIGS. 4A and 4B are cross-sectional views showing display devices according to an embodiment of the present disclosure.
Figure 4B:
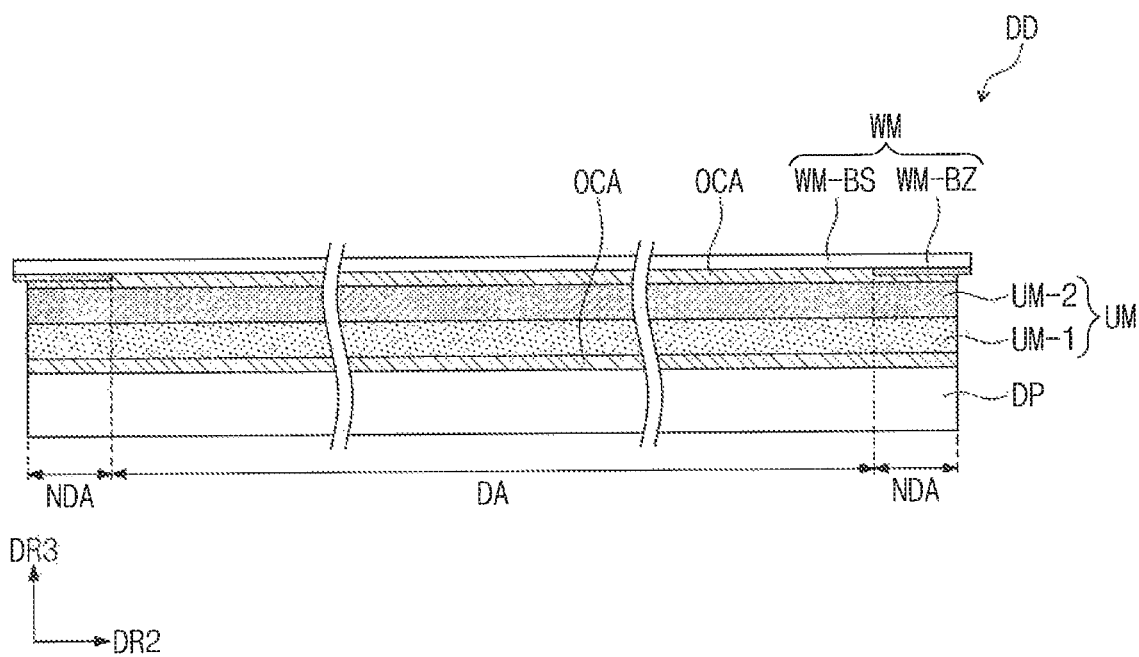

FIGS. 4A and 4B are cross-sectional views showing display devices DD according to an embodiment of the present disclosure. In FIGS. 4A and 4B, the same reference numerals denote the same elements in FIGS. 1 to 3, and thus, detailed descriptions of the same elements will be omitted.

Referring to FIGS. 4A and 4B, the display device DD may include the display panel DP, the upper member UM, and the window WM. The upper member UM may include an input sensor UM-1 and an optical film UM-2. As shown in FIGS. 4A and 4B, the window WM and the optical film UM-2 may be coupled to each other by an adhesive layer OCA. A thickness of the adhesive layer OCA between the window WM and the upper member UM may be greater in the display area DA than in the non-display area NDA.

The optical film UM-2 may have a multi-layer structure including an adhesive layer. The optical film UM-2 may be attached to an upper surface of the input sensor UM-1 by the adhesive layer.

An opening area may be provided in the optical film UM-2 to correspond to the second non-display area TA shown in FIG. 2. Due to the opening area, a transmittance of the natural light signal NL may increase.

As shown in FIGS. 4A and 4B, the window WM may include a base substrate WM-BS and a bezel pattern WM-BZ. The base substrate WM-BS may be provided in the display area DA of the display device DD and the bezel pattern WM-BZ may be provided in the non-display area NDA of the display device DD. The base substrate WM-BS may include a transparent substrate such as a glass substrate. The bezel pattern WM-BZ may have a multi-layer structure of a colored layer and a light blocking layer having a black color. The colored layer and a light blocking layer having the black color may be formed through depositing, printing, and coating processes. According to another embodiment, the bezel pattern WM-BZ may be omitted.

The input sensor UM-1 shown in FIG. 4A may be disposed directly on a base surface provided by the display panel DP. In the present disclosure, the expression that a component "B" is disposed directly on a component "A" may mean that no separate adhesive layers are present between the component "B" and the component "A". The component "B" may be formed on a base surface provided by the component "A" through successive processes after the component "A" is formed.

As shown in FIG. 4B, the input sensor UM-1 may be coupled to the display panel DP after being separately formed. The adhesive layer OCA may be disposed between the input sensor UM-1 and the display panel DP.

Figure 5A:
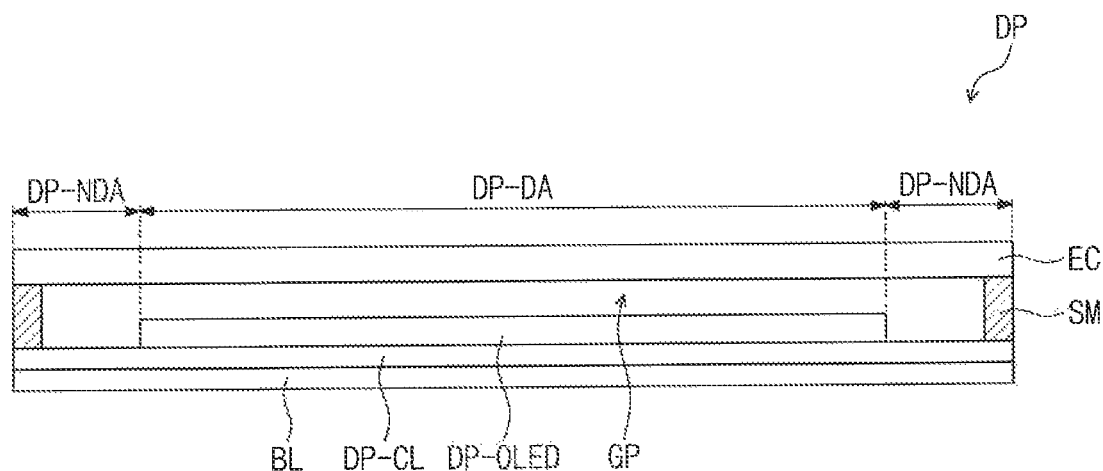
FIG. 5A is a cross-sectional view showing a display panel according to an embodiment of the present disclosure.
Figure 5B:
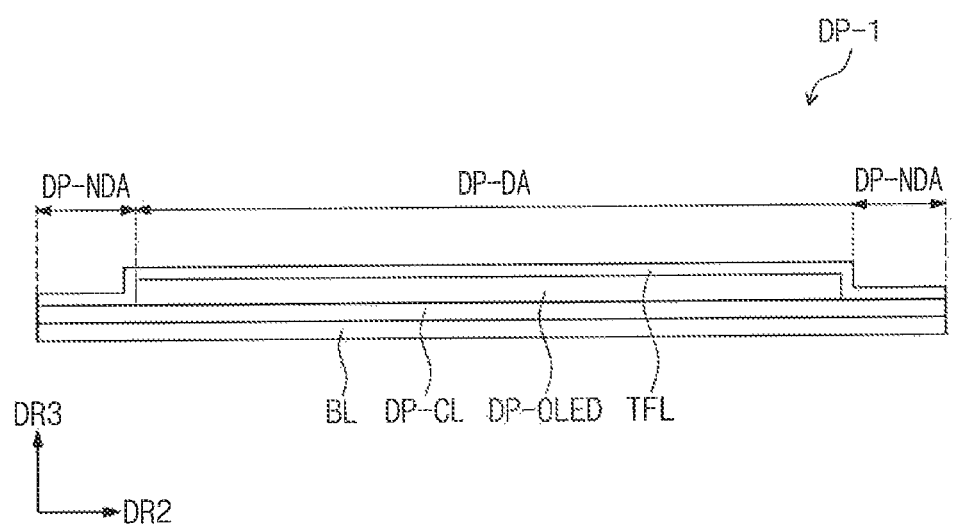
FIG. 5B is a cross-sectional view showing a display panel according to another embodiment of the present disclosure.

FIG. 5A is a cross-sectional view showing a display panel DP according to an embodiment of the present disclosure, and FIG. 5B is a cross-sectional view showing a display panel DP-1 according to another embodiment of the present disclosure.

Referring to FIG. 5A, the display panel DP may include a base layer BL, a circuit layer DP-CL disposed on the base layer BL, a light emitting element layer DP-OLED, an encapsulation substrate EC, and a sealing member SM.

The base layer BL may include a glass substrate. However, it should not be limited to the glass substrate, and the base layer BL may include another substrate as long as the substrate has a uniform refractive index in a visible light wavelength range.

The encapsulation substrate EC may be a transparent substrate. The sealing member SM may attach the base layer BL to the encapsulation substrate EC. The sealing member SM may extend along an edge of the encapsulation substrate EC.

A gap GP formed in the display panel DP may be maintained in a vacuum state, however, the embodiment should not be limited thereto or thereby. The gap GP may be provided between the encapsulation substrate EC and the circuit layer DP-CL, as well as between the encapsulation substrate EC and the light emitting element layer DP-OLED. The gap GP may be filled with air or inert gases (hereinafter, referred to as an "external gas"). The encapsulation substrate EC and the sealing member SM may prevent moisture from entering the display panel DP.

The sealing member SM may include an inorganic adhesive layer such as frit, however, it should not be limited thereto or thereby. The sealing member SM may include an organic adhesive layer. In the present embodiment, since the display panel DP may be completely sealed from the outside, a strength of the display panel DP may increase, and defects of the light emitting element may be prevented.

The circuit layer DP-CL may include at least one insulating layer, semiconductor patterns, and conductive patterns. The insulating layer may include at least one inorganic layer and at least one organic layer. The semiconductor patterns and the conductive patterns may form signal lines, a pixel driving circuit, and a scan driving circuit. This will be described in detail later.

The light emitting element layer DP-OLED may include a display element, e.g., an organic light emitting diode. The light emitting element layer DP-OLED may further include an organic layer such as a pixel definition layer.

Referring to FIG. 5A, an active area DP-DA and a non-active area DP-NDA, which respectively correspond to the display area DA (refer to FIG. 1) and the non-display area NDA (refer to FIG. 1), may be provided in the display panel DP. In the present embodiment, the expression "areas of different members correspond to each other" may mean that the areas of the different members overlap each other, and they should not be limited to having the same area/shape.

Referring to FIG. 5B, the display panel DP-1 does not include the encapsulation substrate EC and the sealing member SM when compared with the display panel DP shown in FIG. 5A. The display panel DP-1 may include a base layer BL, a circuit layer DP-CL disposed on the base layer BL, a light emitting element layer DP-OLED, and an upper insulating layer TFL. In addition, the base layer BL may include a plastic substrate, a glass substrate, a metal substrate, or an organic/inorganic composite substrate. The base layer BL may include at least one polyimide layer.

The upper insulating layer TFL may include a plurality of thin films. Some thin films may be disposed to improve an optical efficiency, and the other thin films may be disposed to protect organic light emitting diodes. The upper insulating layer TFL may include a thin film encapsulation layer having a stack structure of inorganic layer/organic layer/inorganic layer.

The base layer BL may include a glass substrate. However, it should not be limited to the glass substrate, and the base layer BL may include another substrate as long as the substrate has a uniform refractive index in a visible light wavelength range.

Hereinafter, the display panel DP shown in FIG. 5A will be described as a representative example.

Figure 6A:
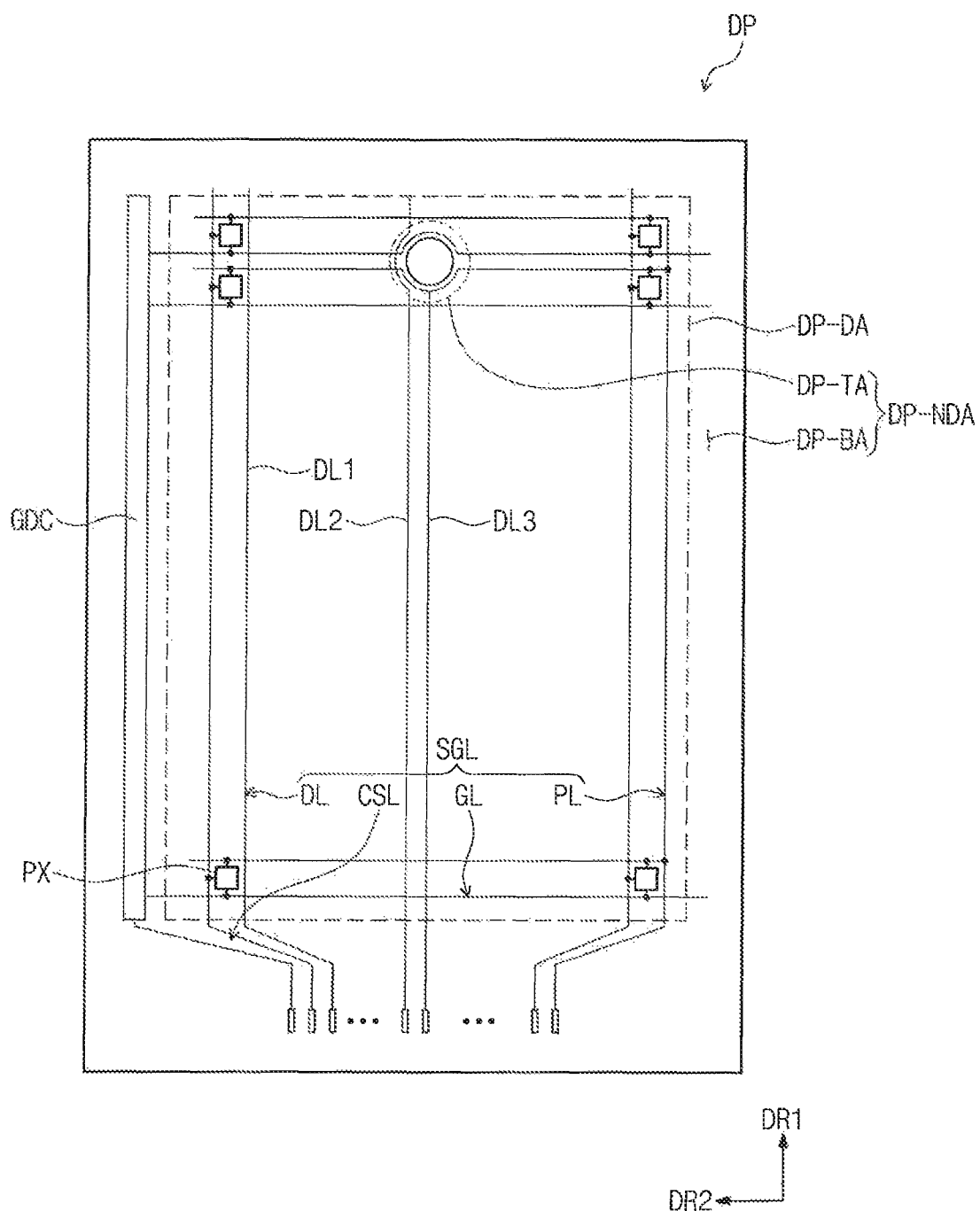
FIG. 6A is a plan view showing a display panel according to an embodiment of the present disclosure.
Figure 6B:
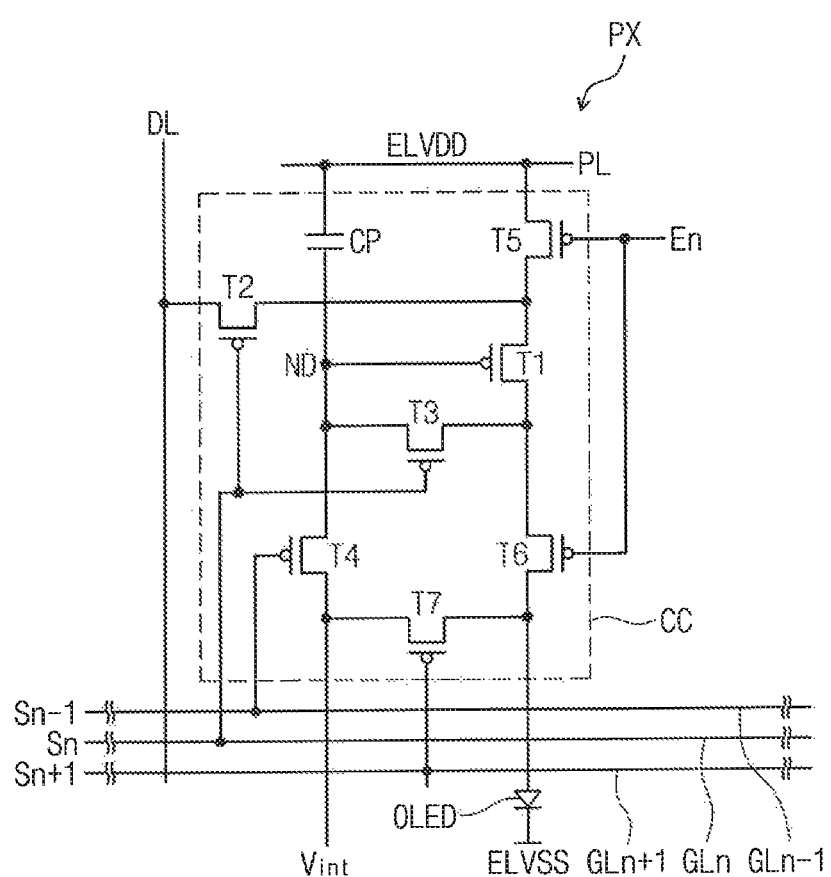
FIG. 6B is an equivalent circuit diagram showing a pixel according to an embodiment of the present disclosure.
Figure 6C:
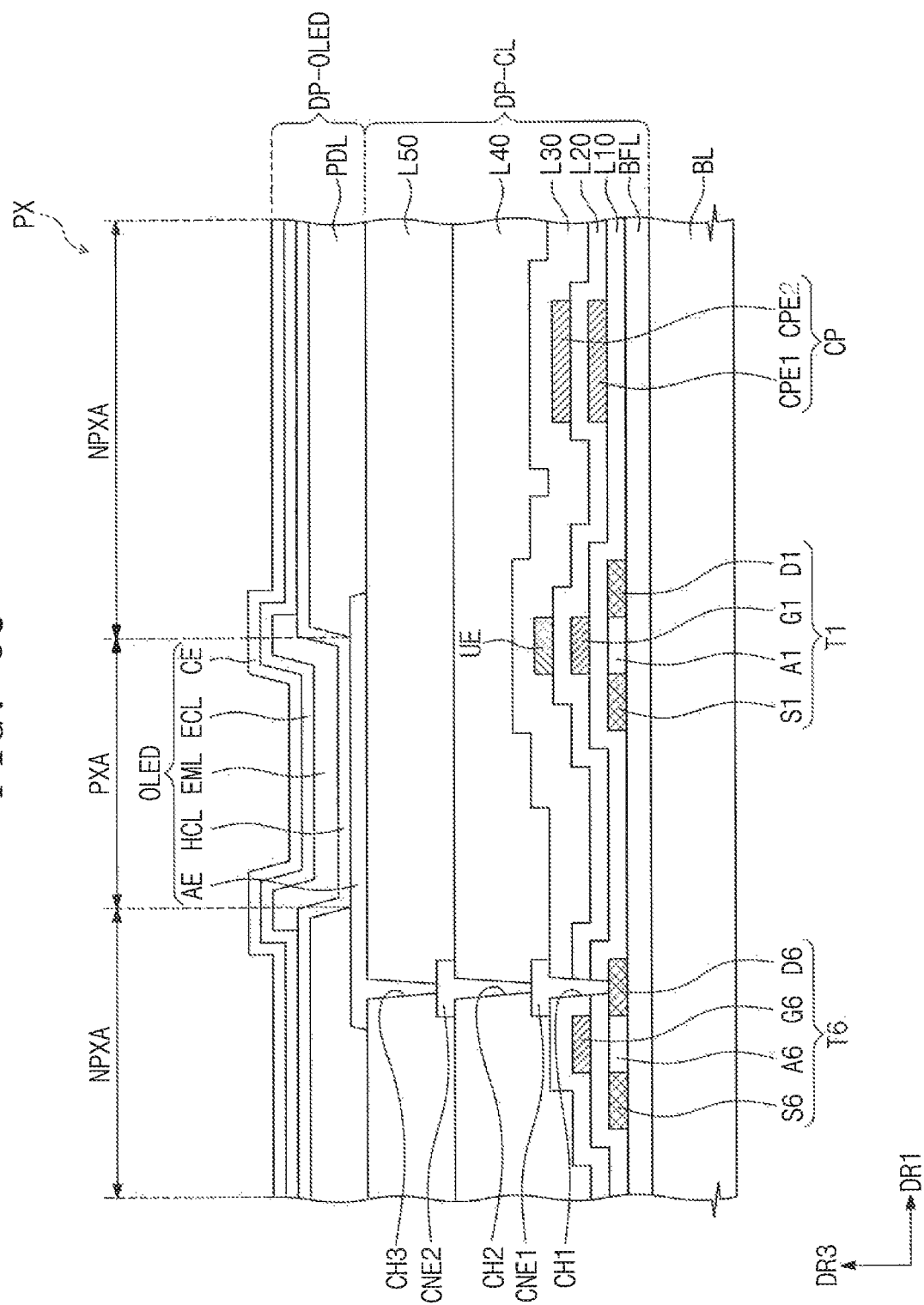
FIG. 6C is a cross-sectional view showing a display panel according to an embodiment of the present disclosure.

FIG. 6A is a plan view showing the display panel DP according to an embodiment of the present disclosure. FIG. 6B is an equivalent circuit diagram showing a pixel PX according to an embodiment of the present disclosure. FIG. 6C is a cross-sectional view showing the display panel DP according to an embodiment of the present disclosure.

Referring to FIG. 6A, the active area DP-DA and the non-active area DP-NDA may be provided in the display panel DP. The non-active area DP-NDA may include a first non-active area DP-BA and a second non-active area DP- TA, which respectively correspond to the first non-display area BZA (refer to FIG. 1) and the second non-display area TA (refer to FIG. 1).

The display panel DP may include a plurality of signal lines SGL, a plurality of pixels PX, and a driving circuit GDC. The pixels PX may be arranged in the active area DP-DA. Each of the pixels PX may include an organic light emitting diode and a pixel driving circuit connected to the organic light emitting diode. The signal lines SGL and the pixel driving circuit may be included in the circuit layer DP-CL shown in FIG. 5A.

The pixels PX may not be arranged in the second non-active area DP-TA. The optical signals may be transmitted through the second non-active area DP-TA. The pixels PX may be arranged to surround the second non-active area DP-TA. The second non-active area DP-TA may have a light transmittance higher than that of the active area DP-DA.

The driving circuit GDC may be disposed in the first non-active area DP-BA. In the present embodiment, the driving circuit GDC may include the scan driving circuit. The scan driving circuit may generate a plurality of scan signals and may sequentially output the scan signals to a plurality of scan lines GL described later. The scan driving circuit may further apply another control signal to the driving circuit of the pixels PX.

The scan driving circuit may include a plurality of thin film transistors formed through the same process as the driving circuit of the pixels PX, for instance, a low temperature polycrystalline silicon (LTPS) process or a low temperature polycrystalline oxide (LTPO) process.

The signal lines SGL may include scan lines GL, data lines DL, a power line PL, and a control signal line CSL. The signal lines SGL may further include reset lines and emission lines. Each of the scan lines GL may be connected to a corresponding pixel PX among the pixels PX, and each of the data lines DL may be connected to a corresponding pixel PX among the pixels PX. The power line PL may be connected to the pixels PX. The control signal line CSL may apply control signals to the scan driving circuit.

The signal lines SGL may be connected to a circuit board. The signal lines SGL may be connected to a timing controller mounted on the circuit board in the form of integrated chip.

The data lines DL may include three types of data lines. A first-type data line DL1 may be connected to all pixels PX arranged in a corresponding pixel column. The first-type data line DL1 may be spaced apart from the second non-active area DP-TA. The first-type data line DL1 may be located near an edge of the active area DP-DA. A second-type data line DL2 may be connected to all pixels PX arranged in a corresponding pixel column and may be disposed adjacent to the second non-active area DP-TA. In addition, the second-type data line DL2 may be connected to some pixels PX arranged in another pixel column disposed adjacent to the corresponding pixel column. A portion of the second-type data line DL2 may extend along the second non-active area DP-TA. For example, a portion of the second-type data line DL2 may have a curved shape as it extends along the second non-active area DP-TA. A third-type data line DL3 may be connected to some pixels PX arranged in a corresponding pixel column and may be shorter than the first-type data line DL1. An end of the third-type data line DL3 may be disposed adjacent to the second non-active area DP-TA. For example, the third-type data line DL3 may not extend around the second non-active area DP-TA.

FIG. 6B shows one pixel PX disposed in an n-th pixel row. The pixel PX may include a light emitting element OLED and a pixel driving circuit CC. In the present disclosure, the organic light emitting diode will be described as the light emitting element OELD, however, the light emitting element OELD should not be limited to the organic light emitting diode. The pixel PX may be connected to an (n−1)th scan line GLn−1, an n-th scan line GLn, and an (n+1)th scan line GLn+1. The pixel PX may be connected to an n-th reset line and an n-th emission line.

The pixel driving circuit CC may include a plurality of transistors T1 to T7 and a capacitor CP. The pixel driving circuit CC may control an amount of current flowing through the light emitting element OLED in response to a data signal.

The light emitting element OLED emits a light at a predetermined luminance in response to the amount of the current provided from the pixel driving circuit CC. To accomplish this, a first power voltage ELVDD has a level that is higher than a level of a second power voltage ELVSS.

Each of the transistors T1 to T7 may include an input electrode (or source), an output electrode (or drain), and a control electrode (or gate).

An input electrode of a first transistor T1 may be connected to the first power voltage ELVDD via a fifth transistor T5, and an output electrode of the first transistor T1 may be connected to a first electrode of the light emitting element OLED via a sixth transistor T6. The first electrode of the light emitting element OLED may be an anode electrode. The first transistor T1 may control the amount of the current flowing through the light emitting element OLED in response to a voltage applied to a control electrode thereof. The first transistor T1 may be referred to as a "driving transistor" in the present disclosure.

A second transistor T2 may be connected between the data line DL and the input electrode of the first transistor T1. A control electrode of the second transistor T2 may be connected to the n-th scan line GLn. The second transistor T2 may be turned on in response to an n-th scan signal Sn applied to the n-th scan line GLn to electrically connect the data line DL to the input electrode of the first transistor T1. In this case, for example, a data voltage of the data line DL may be provided to the input terminal of the first transistor T1.

A third transistor T3 may be connected between the output electrode and the control electrode of the first transistor T1. A control electrode of the third transistor T3 may be connected to the n-th scan line GLn. The third transistor T3 may be turned on in response to the n-th scan signal Sn to electrically connect the output electrode of the first transistor T1 to the control electrode of the first transistor T1. Accordingly, when the third transistor T3 is turned on, the first transistor T1 is connected in a diode configuration.

A fourth transistor T4 may be connected between a reference node ND and an initialization voltage generator. A control electrode of the fourth transistor T4 may be connected to the (n−1)th scan line GLn−1. The fourth transistor T4 may be turned on in response to an (n−1)th scan signal Sn−1 applied to the (n−1)th scan line GLn−1 to provide an initialization voltage Vint to the reference node ND. The initialization voltage Vint may be provided through the n-th reset line.

The fifth transistor T5 may be connected between the power line PL and the input electrode of the first transistor T1. A control electrode of the fifth transistor T5 may be connected to the n-th emission line. The fifth transistor T5 may be turned on in response to an n-th emission signal En.

The sixth transistor T6 may be connected between the output electrode of the first transistor T1 and the first electrode of the light emitting element OLED. A control electrode of the sixth transistor T6 may be connected to the n-th emission line. The sixth transistor T6 may be turned on in response to the n-th emission signal En.

A seventh transistor T7 may be connected between the initialization voltage generator and the first electrode of the light emitting element OLED. A control electrode of the seventh transistor T7 may receive an (n+1)th scan signal Sn+1. The seventh transistor T7 may provide the initialization voltage Vint to the first electrode of the light emitting element OLED in response to the (n+1)th scan signal Sn+1.

The capacitor CP may be disposed between the power line PL and the reference node ND. The capacitor CP may be charged with a voltage corresponding to the data signal. When the fifth and sixth transistors T5 and T6 are turned on, the amount of the current flowing through the first transistor T1 may be determined by the voltage charged in the capacitor CP.

In the present disclosure, the configurations of the pixel driving circuit CC should not be limited to the equivalent circuit shown in FIG. 6B. According to another embodiment of the present disclosure, the pixel driving circuit CC may be implemented in various ways to allow the light emitting element OLED to emit the light.

FIG. 6C shows a cross-section showing the pixel PX. The base layer BL may include a glass substrate.

In the present embodiment, the circuit layer DP-CL may include a buffer layer BFL, a first intermediate inorganic layer L10, a second intermediate inorganic layer L20, and a third intermediate inorganic layer L30, each of which is an inorganic layer, and may include a first intermediate organic layer L40 and a second intermediate organic layer L50, each of which is an organic layer.

A semiconductor pattern may be disposed on the buffer layer BFL. The semiconductor pattern may include a silicon semiconductor. The semiconductor pattern may include polycrystalline silicon, however, it should not be limited thereto or thereby. The semiconductor pattern may include amorphous silicon. The semiconductor pattern may include metal oxide.

The semiconductor pattern may have different electrical properties depending on whether it is doped with a P-type dopant or an N-type dopant. The semiconductor pattern may include a first-doped region with a high conductivity and a second-doped region with a low conductivity. The first-doped region may be doped with the N-type dopant or the P-type dopant. A P-type transistor may include a doped region doped with the P-type dopant. The second-doped region may be a non-doped region or may be doped with a low doping concentration compared with the first-doped region.

The first-doped region may have a conductivity greater than that of the second-doped region and may serve as an electrode or a signal line. The second-doped region may correspond to an active (or channel) of the transistor. In other words, a portion of the semiconductor pattern may be the active or the channel, another portion of the semiconductor pattern may be the source (or an input electrode area) or the drain (or an output electrode area), and the other portion of the semiconductor pattern may be a connection signal line (or a connection electrode).

As shown in FIG. 6C, a source S1, an active A1, and a drain D1 of the first transistor T1 may be formed from the semiconductor pattern, and a source S6, an active A6, and a drain D6 of the sixth transistor T6 may be formed from the semiconductor pattern. The sources S1 and S6 and the drains D1 and D6 may extend from the actives A1 and A6 in opposite directions to each other when viewed in a cross-sectional view.

The control electrodes G1 and G6 may be disposed on the first intermediate inorganic layer L10 to overlap the actives A1 and A6, respectively. A first capacitor electrode CPE1 of the capacitor CP may be disposed on the first intermediate inorganic layer L10. A second capacitor electrode CPE2 of the capacitor CP may be disposed on the second intermediate inorganic layer L20. The first capacitor electrode CPE1 and the second capacitor electrode CPE2 may face each other to form the capacitor CP. An upper electrode UE overlapping the control electrode G1 may be disposed on the second intermediate inorganic layer L20.

A first connection electrode CNE1 may be disposed on the third intermediate inorganic layer L30. The first connection electrode CNE1 may be connected to the drain D6 of the sixth transistor T6 through a first through hole CH1. A second connection electrode CNE2 may be disposed on the first intermediate organic layer L40. The second connection electrode CNE2 may be connected to the first connection electrode CNE1 through a second through hole CH2. Conductive patterns different from the first connection electrode CNE1 may be disposed on the third intermediate inorganic layer L30, and conductive patterns different from the second connection electrode CNE2 may be disposed on the first intermediate organic layer L40. The conductive patterns may form the signal line shown in FIG. 6A, e.g., the data line DL.

A first electrode AE of the light emitting element OLED may be disposed on the second intermediate organic layer L50. The first electrode AE may be connected to the second connection electrode CNE2 through a third through hole CH3. A pixel definition layer PDL may expose at least a portion of the first electrode AE. For example, at least a portion of the first electrode AE may be exposed through an opening in the pixel definition layer PDL.

The active area DP-DA may include a light emitting area PXA and a non-light-emitting area NPXA adjacent to the light emitting area PXA. The non-light-emitting area NPXA may surround the light emitting area PXA. In the present embodiment, the light emitting area PXA may correspond to the portion of the first electrode AE exposed through the pixel definition layer PDL.

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may correspond to the first electrode AE exposed through the pixel definition layer PDL. In other words, the light emitting layer EML may be formed in each pixel PX after being divided into plural portions. The light emitting layer EML may include an organic material and/or an inorganic material. The light emitting layer EML may generate a predetermined color light.

An electron control layer ECL may be disposed on the light emitting layer EML. The electron control layer ECL may include an electron transport layer and may further include an electron injection layer. The hole control layer HCL and the electron control layer ECL may be commonly formed in the pixels PX using an open mask. A second electrode CE may be disposed on the electron control layer ECL. The second electrode CE may be commonly disposed in the pixels PX.

Figure 7A:
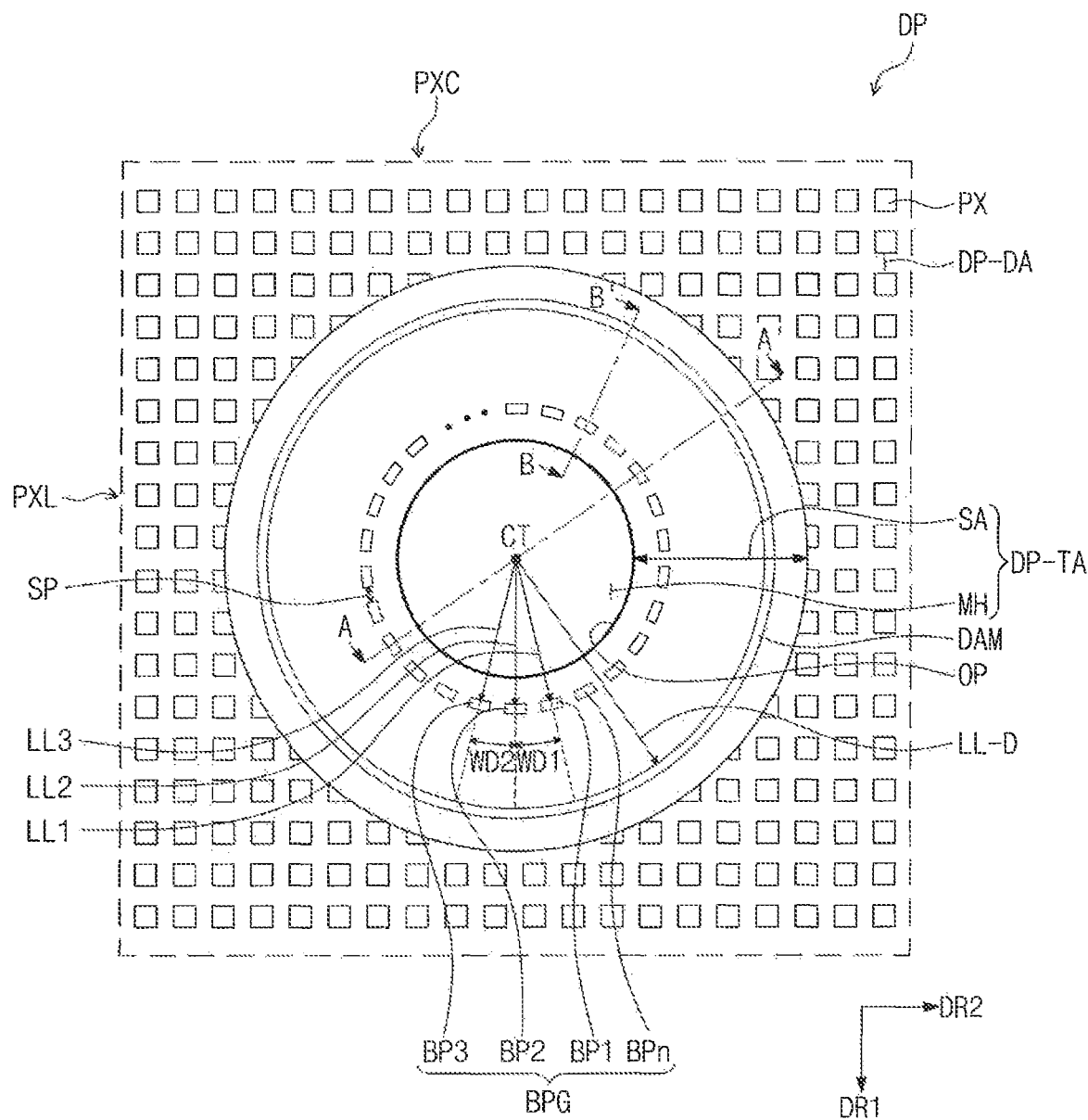
FIG. 7A is an enlarged plan view showing a display panel according to an embodiment of the present disclosure.
Figure 7B:
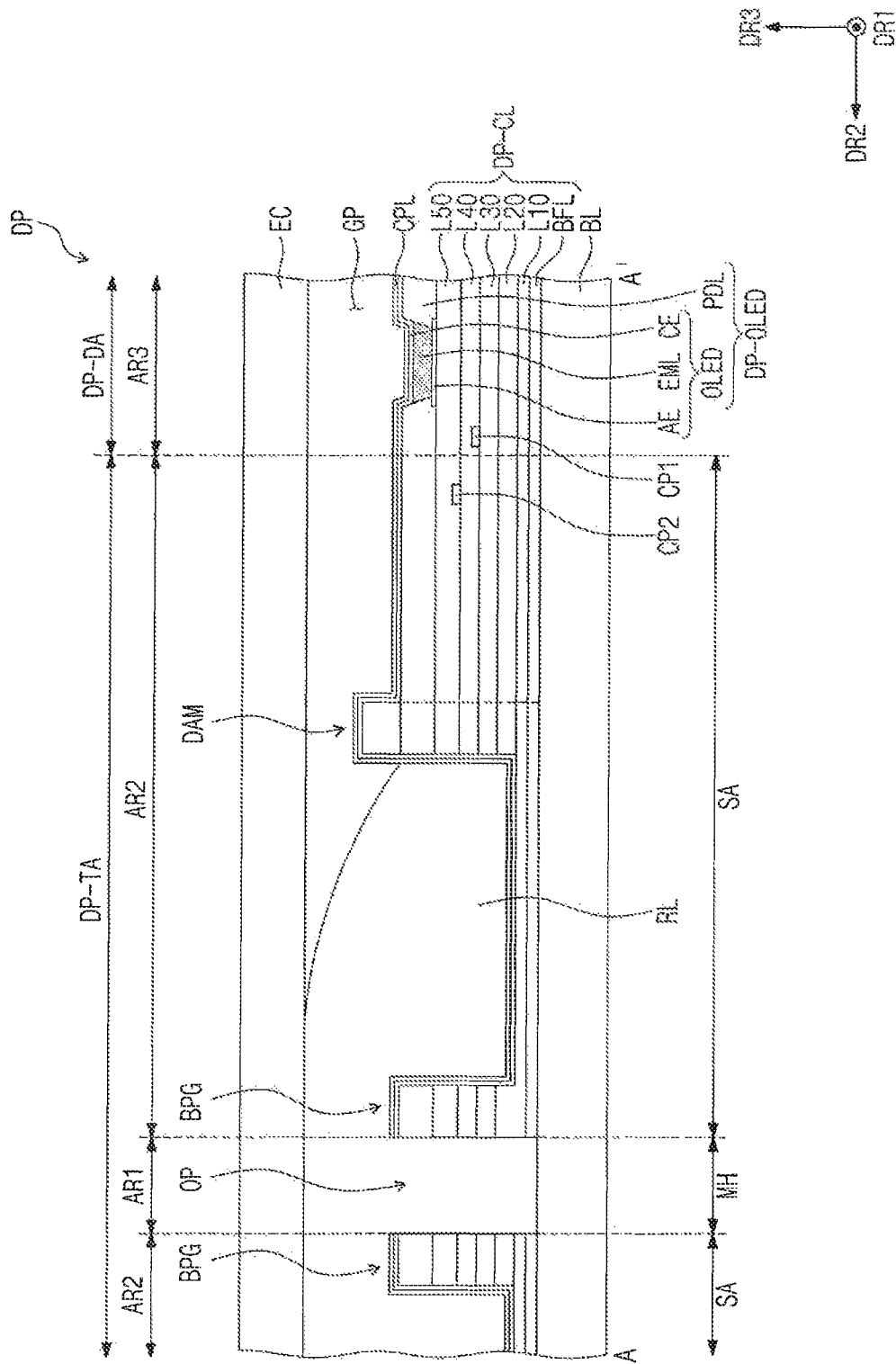
FIGS. 7B, 7C, and 7D are cross-sectional views taken along a line A-A' of FIG. 7A.
Figure 7C:
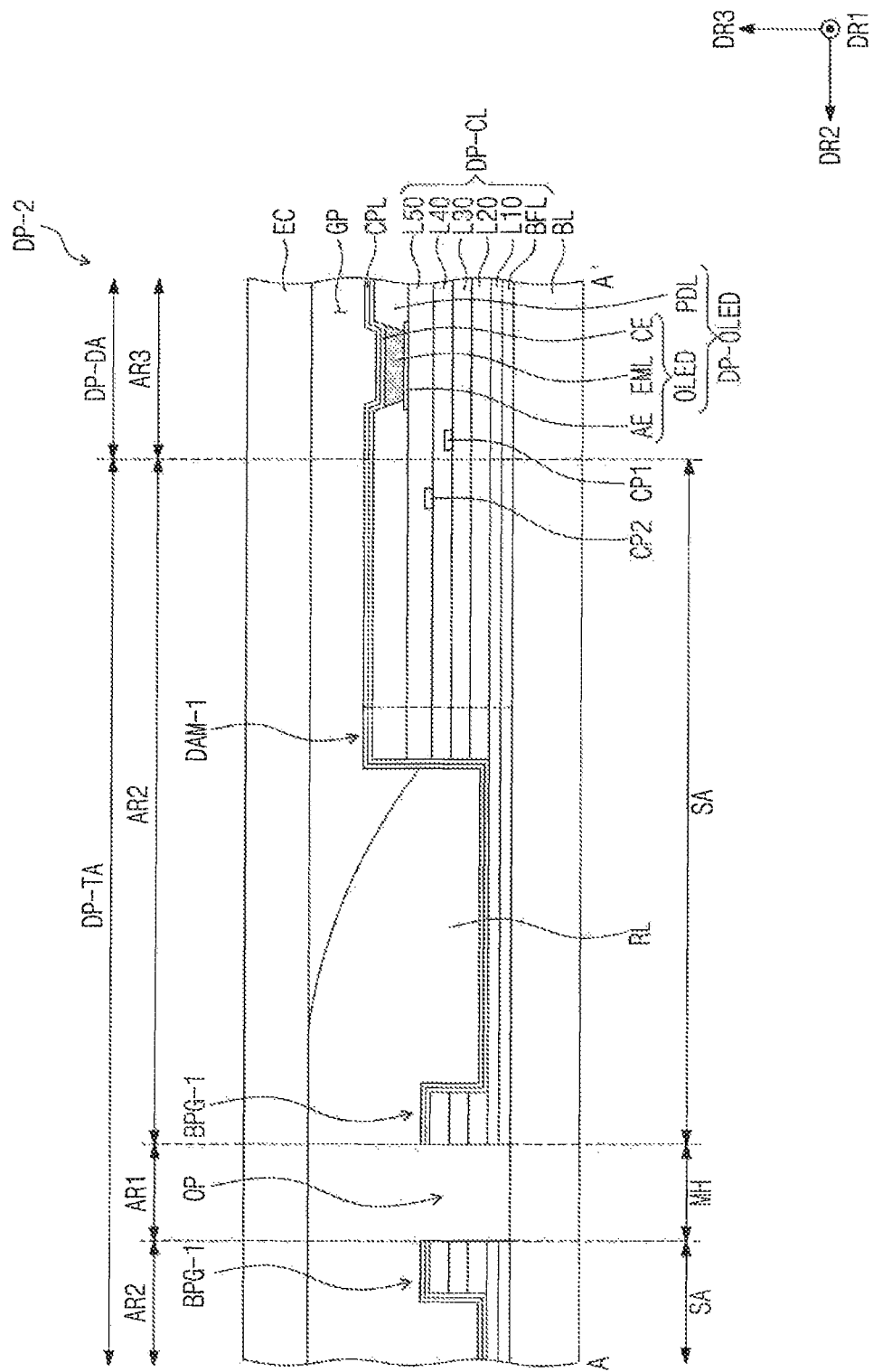
Figure 7D:
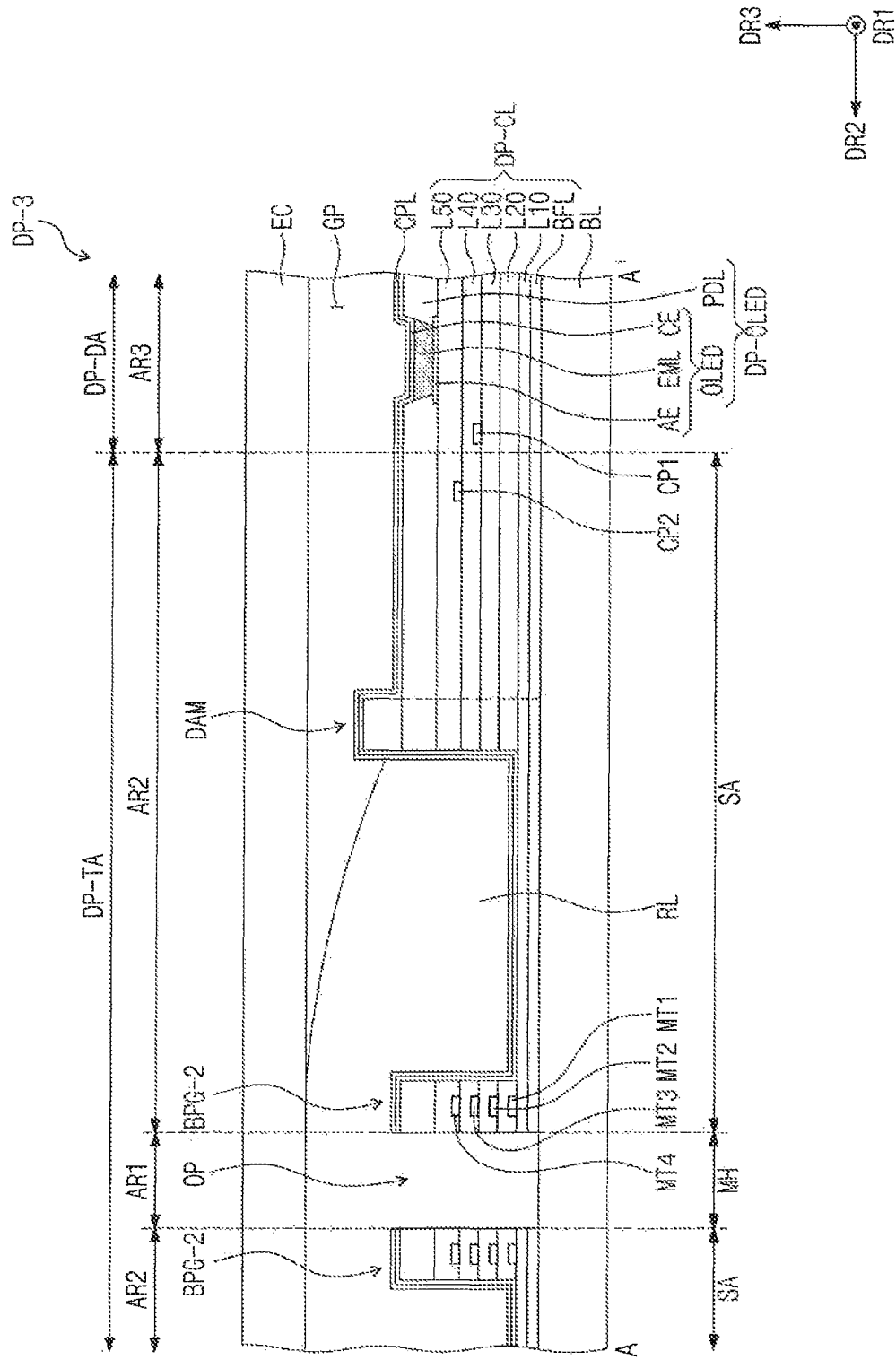

FIG. 7A is an enlarged plan view showing a display panel DP according to an embodiment of the present disclosure. FIGS. 7B, 7C, and 7D are cross-sectional views taken along a line A-A' of FIG. 7A.

FIG. 7A shows the second non-active area DP-TA and the active area DP-DA around the second non-active area DP-TA of the display panel DP.

Referring to FIG. 7A, the pixels PX may be arranged in the active area DP-DA. The pixels PX arranged in the second direction DR2 may define a pixel row PXL, and the pixels PX arranged in the first direction DR1 may define a pixel column PXC. Each of the pixel row PXL and the pixel column PXC is partially disconnected by the second non-active area DP-TA. For example, a pixel row PXL may be separated by the second non-active area DP-TA and, similarly, a pixel column PXC may be separated by the second non-active area DP-TA.

According to the present embodiment, a hole OP may be provided in the display panel DP. The hole OP may have a shape recessed from an upper surface of the display panel DP. For example, the hole OP may be an opening extending from the upper surface of the display panel DP to an upper surface of the base layer BL, however, the present embodiment should not be limited thereto or thereby. The hole OP may be an opening extending from the upper surface of the display panel DP to a portion of the circuit layer DP-CL. According to the present embodiment, a separate opening or groove may not be formed in the base layer BL, however, it should not be limited thereto or thereby.

According to the present embodiment, the hole OP may have a circular shape with a center CT, however, it should not be limited thereto or thereby. The hole OP may have a polygonal shape, and the hole OP may be provided in plural.

The pixel PX may not be disposed in the second non-active area DP-TA. The second non-active area DP-TA may include a signal transmission area MH and a peripheral area SA adjacent to the signal transmission area MH. The signal transmission area MH may be the hole OP. The peripheral area SA may surround the signal transmission area MH.

A division pattern BPG may be disposed on the peripheral area SA to surround the hole OP. The division pattern BPG may include a first division pattern BP1, a second division pattern BP2, and a third division pattern BP3, which are sequentially arranged around the hole OP. The first, second, and third division patterns BP1, BP2, and BP3 may be spaced apart from each other. The first, second, and third division patterns BP1, BP2, and BP3 may be arranged along a single line surrounding the hole OP.

According to the present embodiment, the first, second, and third division patterns BP1, BP2, and BP3 may be spaced apart from the center CT of the hole OP at the same distance. For example, a first length LL1 between the center CT and the first division pattern BP1, a second length LL2 between the center CT and the second division pattern BP2, and a third length LL3 between the center CT and the third division pattern BP3 may be substantially the same as each other.

The division pattern BPG may further include a division pattern disposed adjacent to the third division pattern BP3 and a division pattern disposed adjacent to the first division pattern BP1. The division pattern BPG may include first, second, third, ..., and n-th division patterns BP1, BP2, BP3, ..., and BPn. The first, second, third, ..., and n-th division patterns BP1, BP2, BP3, ..., and BPn may be spaced apart from each other and may surround the hole OP. For example, the first, second, third, ..., and n-th division patterns BP1, BP2, BP3, ..., and BPn may be arranged in a circular shape and may be spaced apart from each other when viewed in a plan view.

According to the present embodiment, a first distance WD1 that is a separation distance between the first division pattern BP1 and the second division pattern BP2 may be substantially the same as a second distance WD2 that is a separation distance between the second division pattern BP2 and the third division pattern BP3. The first distance WD1 corresponds to a distance between a center of the first division pattern BP1 and a center of the second division pattern BP2, and the second distance WD2 corresponds to a distance between the center of the second division pattern BP2 and a center of the third division pattern BP3. The space (or opening) between the first and second division patterns BP1 and BP2 and space (or opening) between the second and third division patterns BP2 and BP3 may be substantially the same.

As used herein in connection with length, the term "substantially the same" may mean that the lengths are the same within an allowable process tolerance.

Since the first distance WD1 is substantially the same as the second distance WD2, a fluid may not be concentrated at a specific area and may be dispersed at the same speed through spaces SP between the first, second, third, ..., n-th division patterns BP1, BP2. BP3, ..., BPn when the fluid filled in the hole OP passes through the division pattern BPG on the second area AR2.

The display panel DP according to the present embodiment may further include a dam DAM. The dam DAM may be disposed in the peripheral area SA and may have a closed curve shape surrounding the hole OP. Since the dam DAM has the closed curve shape, the fluid filled in the hole OP may be prevented from flowing to the active area DP-DA crossing the peripheral area SA. In other words, the dam DAM may prevent fluid filled in the hole from reaching the pixels PX.

A length LL-D from the center CT of the hole OP to the dam DAM may be greater than the first, second, and third lengths LL1, LL2, and LL3. In other words, the division pattern BPG may be disposed between the hole OP and the dam DAM. The division pattern BPG may be disposed closer to the hole OP than the dam DAM is. The dam DAM may be disposed closer to the active area DP-DA than the division pattern BPG is.

FIG. 7B is a cross-sectional view taken along a line A-A' of FIG. 7A. FIG. 7B schematically shows a light emitting element OLED compared with FIG. 6C and does not show transistors T1 and T6 and a capacitor CP.

Referring to FIG. 7B, the display panel DP may include a base layer BL, a circuit layer DP-CL, a light emitting element layer DP-OLED, and a capping layer CPL.

The light emitting element layer DP-OLED may include a light emitting element OLED and a pixel definition layer PDL.

The capping layer CPL may be disposed on the light emitting element layer DP-OLED.

The capping layer CPL may be disposed on a second electrode CE and may be in contact with the second electrode CE. The capping layer CPL may include an organic material. The capping layer CPL may protect the second electrode CE from a subsequent process, e.g., a sputtering process, and may improve a light emission efficiency of the light emitting element OLED.

A first area AR1, a second area AR2, and a third area AR3 may be provided in the display panel DP.

The first area AR1 may be an area in which the circuit layer DP-CL and the light emitting element layer DP-OLED are not disposed on the base layer BL and may have a light transmittance greater than that of other areas. For example, the light transmittance of the first area AR1 may be greater than that of the second area AR2 and the third area AR3 in which at least one of the circuit layer DP-CL and the light emitting element layer DP-OLED is disposed. The first area AR1 may correspond to the signal transmission area MH. In the electronic apparatus ED (refer to FIG. 2), the electronic optical module ELM may overlap the first area AR1 and may be disposed under the display panel DP. The electronic optical module ELM may receive signals from the outside or may transmit the signals to the outside through the signal transmission area MH.

The hole OP may be an opening extended from an upper surface of the display panel DP to a lower surface of the circuit layer DP-CL. In the present embodiment, the upper surface of the display panel DP may correspond to an upper surface of the capping layer CPL. The bottom of the hole OP may correspond to an upper surface of the base layer BL.

The second area AR2 may surround the first area AR1 and may overlap the circuit layer DP-CL. The second area AR2 may be disposed on opposite sides of the first area AR1 The second area AR2 may not overlap the light emitting element OLED. The second area AR2 may correspond to the peripheral area SA. The division pattern BPG and the dam DAM may be disposed in the second area AR2. For example, each of the division pattern BPG and the dam DAM may surround the first area AR. Details on the division pattern BPG and the dam DAM described above may be equally applied to the division pattern BPG and the dam DAM of FIG. 7B. The division pattern BPG may be disposed closer to the first area AR1 in which the hole OP is provided than the dam DAM is. For example, the division pattern BPG may be disposed adjacent to the hole OP and the division pattern BPG may be provided between the hole OP and the dam DAM.

The division pattern BPG may be disposed on the base layer BL and may include a plurality of layers. For example, the division pattern BPG may include the same material as that of the circuit layer DP-CL and the pixel definition layer PDL. The division pattern BPG may include the plural layers formed through the same process as that of each of the circuit layer DP-CL and the pixel definition layer PDL.

The dam DAM may be disposed on the base layer BL and may include a plurality of layers. For example, the dam DAM may include the same material as that of at least one of the circuit layer DP-CL and the pixel definition layer PDL. According to the present embodiment, some of the layers forming the dam DAM may be provided integrally with the circuit layer DP-CL and the pixel definition layer PDL, which are disposed in the active area DP-DA. For example, the dam DAM may include the plural layers formed through the same process as that of each of the circuit layer DP-CL and the pixel definition layer PDL and may further include an additional organic layer. The additional organic layer may be provided on the pixel definition layer PDL in the dam DAM.

Accordingly, the dam DAM may have a height greater than that of the division pattern BPG. However, according to an embodiment the present disclosure, the height of the dam DAM may be adjusted such that the dam DAM is spaced apart from an encapsulation substrate EC in the third direction DR3. In other words, a space may be provided between the top of the dam DAM and the encapsulation substrate EC. The third area AR3 may overlap the light emitting element OLED. A first electrode AE, a light emitting layer EML, and the second electrode CE may be disposed in the third area AR3. The third area AR3 may correspond to the active area DP-DA.

A signal line may be disposed in the second area AR2 and the third area AR3. The signal line may be a conductive pattern formed through the same process as the first connection electrode CNE1 or the second connection electrode CNE2 described with reference to FIG. 6C. FIG. 7B shows a first signal line CP1 disposed on a third intermediate inorganic layer L30 and a second signal line CP2 disposed on a first intermediate organic layer L40. The first signal line CP1 and the second signal line CP2 may be signal lines distinguished from each other or may be connected to each other through a contact hole in the first intermediate organic layer L40. In other words, the first signal line CP1 and the second signal line CP2 may be portions of one signal line, which are disposed on different layers from each other.

The display panel DP according to the present embodiment may include a compensation layer RL disposed to overlap the hole OP. The compensation layer RL may be disposed on the capping layer CPL.

For example, the compensation layer RL may overlap the first area AR1 and the second area AR2 and may not overlap the third area AR3. The compensation layer RL may overlap at least a portion of the second area AR2.

The encapsulation substrate EC may be disposed on the compensation layer RL. For example, the compensation layer RL may be in contact with a lower surface of the encapsulation substrate EC. For example, a first portion of the compensation layer RL may be in contact with the encapsulation substrate EC and a second portion of the compensation layer RL may not contact the encapsulation substrate EC.

According to an embodiment of the present disclosure, the compensation layer RL may be obtained by curing a fluid with viscosity and liquidity. For example, the compensation layer RL may be obtained by curing a liquid silicon-based material, however, the present embodiment should not be limited thereto or thereby. The compensation layer RL may be obtained by curing an organic material. For example, the fluid may be provided between the encapsulation substrate EC and the display panel DP to overlap the hole OP and may flow in a direction toward the dam DAM from the hole OP when the encapsulation substrate EC is pressed against the display panel DP. The fluid may be cured while flowing toward the dam DAM from the hole OP, and the cured fluid may form the compensation layer RL.

The display device DD of the present disclosure may include the division pattern BPG disposed in the second area AR2, and thus, may control the fluid such that it flows at a constant speed in the second area AR2 even when the fluid forming the compensation layer RL overflows to the second area AR2 after being filled in the hole OP. In addition, the display device DD of the present disclosure may include the division pattern BPG disposed between the hole OP and the dam DAM, and thus, may prevent the fluid from overflowing to the third area AR3 over the dam DAM.

Accordingly, the compensation layer RL formed by the cured fluid may overlap the first area AR1 and the second area AR2 and may not overlap the third area AR3. For example, the compensation layer RL may not overlap at least a portion of the second area AR2 and may overlap at least a portion of the second area AR2. In other words, the compensation layer R L may overlap a first portion of the second area AR2 and not overlap a second portion of the second area AR2. For example, the compensation layer RL may be in contact with at least a portion of the dam DAM as shown in FIG. 7B.

A gap GP between the encapsulation substrate EC and the compensation layer RL or between the encapsulation substrate EC and the capping layer CPL may be maintained in a vacuum state.

FIG. 7C is a cross-sectional view taken along a line A-A' of FIG. 7 to show a display panel DP-2 according to another embodiment of the present disclosure.

Different from the division pattern BPG shown in FIG. 7A, a division pattern BPG-1 shown in FIG. 7C may include the same material as that of a portion of a base layer BL and a circuit layer DP-CL. For example, the division pattern BPG-1 may include layers formed through the same process as a buffer layer BFL, a first intermediate inorganic layer L10, a second intermediate inorganic layer L20, and a third intermediate inorganic layer L30, respectively. The division pattern BGP-1 may not include a first intermediate organic layer L40, a second intermediate organic layer L50, and a pixel definition layer PDL. However, the present embodiment should not be limited thereto or thereby, and some of components of the division pattern BPG-1 may be omitted, or the division pattern BPG-1 may further include other layers.

A dam DAM-1 may include a plurality of layers and may have a height greater than a height of the division pattern BPG-1. For example, the dam DAM-1 may include layers formed through the same process as the base layer BL, the buffer layer BFL, the first intermediate inorganic layer L10, the second intermediate inorganic layer L20, the third intermediate inorganic layer L30, the first intermediate organic layer L40, the second intermediate organic layer L50, and the pixel definition layer PDL, respectively. However, the present embodiment should not be limited thereto or thereby, and some of components of the dam DAM-1 may be omitted, or the dam DAM-1 may further include other layers.

In FIG. 7C, the dam DAM-1 may indicate an end of the circuit layer DP-CL and an end of the pixel definition layer PDL. For example, the circuit layer DP-CL and the pixel definition layer PDL may overlap the active area DP-DA and may extend to the second non-active area DP-TA from the active area DP-DA. The circuit layer DP-CL and the pixel definition layer PDL may overlap a portion of the second non-active area DP-TA.

For example, the circuit layer DP-CL and the pixel definition layer PDL may extend to a portion of the second area AR2. The dam DAM-1 may indicate the end of the circuit layer DP-CL and the end of the pixel definition layer PDL in the second area AR2.

FIG. 7D is a cross-sectional view taken along a line A-A' of FIG. 7A to show a display panel DP-3 according to another embodiment of the present disclosure.

A division pattern BPG-2 of FIG. 7D may include a plurality of layers. The division pattern BPG-2 may include a conductive layer. For example, the division pattern BPG-2 may include at least one of a first conductive layer MT1, a second conductive layer MT2, a third conductive layer MT3, and a fourth conductive layer MT4. The first conductive layer MT1 may be a conductive pattern disposed between a first intermediate inorganic layer L10 and a second intermediate inorganic layer L20. The second conductive layer MT2 may be a conductive pattern disposed between the second intermediate inorganic layer L20 and a third intermediate inorganic layer L30. The third conductive layer MT3 may be a conductive pattern disposed between the third intermediate inorganic layer L30 and a first intermediate organic layer L40. The third conductive layer MT3 may be formed through the same process as the first connection electrode CNE1 shown in FIG. 6C. The fourth conductive layer MT4 may be a conductive pattern disposed between the first intermediate organic layer L40 and a second intermediate organic layer L50. The fourth conductive layer MT4 may be formed through the same process as the second connection electrode CNE2 shown in FIG. 6C.

The division pattern BPG-2 may include at least one of the first, second, third, and fourth conductive layers MT1, MT2, MT3, and MT4, and thus, may compensate for a step difference in a base layer BL or a circuit layer DP-CL. In other words, the display panel DP-3 may include the division pattern BPG-2 including at least one of the first, second, third, and fourth conductive layers MT1, MT2, MT3, and MT4 to provide a flat surface in the peripheral area SA.

The division pattern BPG-2 shown in FIG. 7D includes all the first, second, third, and fourth conductive layers MT1, MT2, MT3, and MT4, however, it should not be limited thereto or thereby. For example, the division pattern BPG-2 according to another embodiment may include only the first, second, and third conductive layers MT1, MT2, and MT3.

Descriptions of the elements in the embodiments shown in FIGS. 7B and 7C will be equally applied to the same elements of FIG. 7D.

Figure 8A:
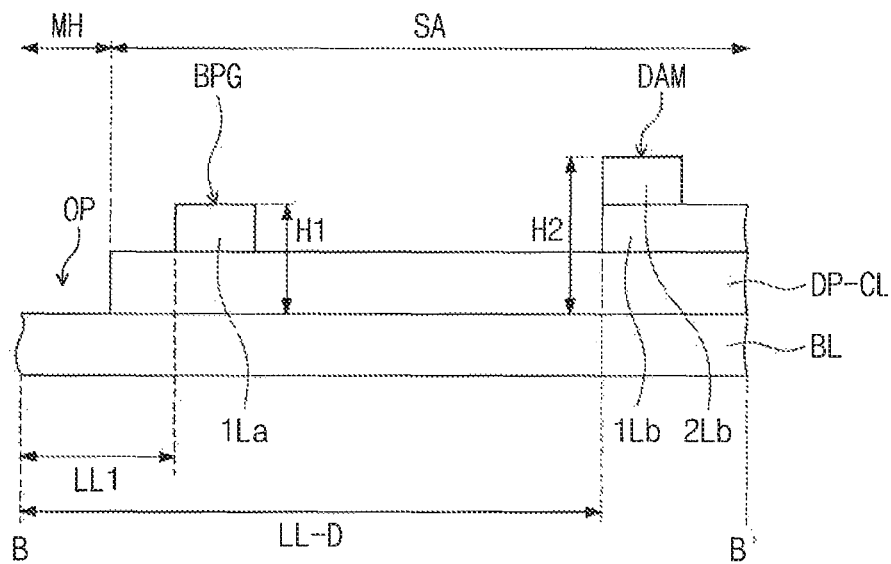
FIGS. 8A, 8B, and 8C are cross-sectional views taken along a line B-B' of FIG. 7A.
Figure 8B:
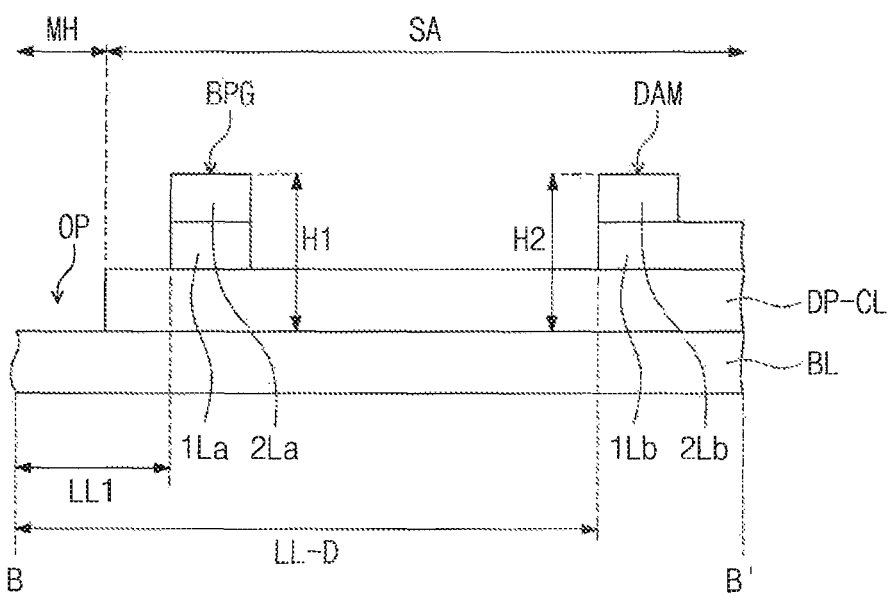
Figure 8C:
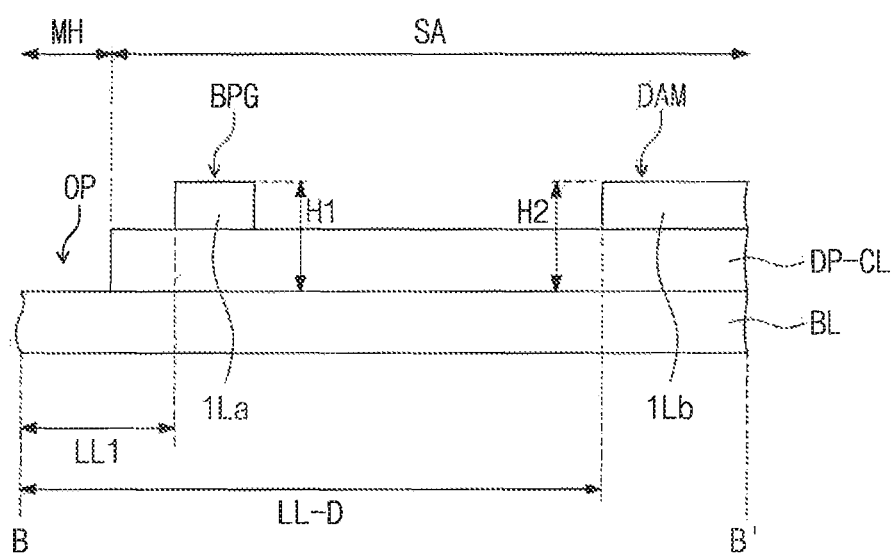

FIGS. 8A, 8B, and 8C are cross-sectional views taken along a line B-B' of FIG. 7A.

FIG. 8A shows the hole OP in the signal transmission area MH and the division pattern BPG and the dam DAM disposed in the peripheral area SA.

The division pattern BPG may include the circuit layer DP-CL and a first layer 1La. For example, the first layer 1La may include the same material as that of the pixel definition layer PDL (refer to FIG. 7B). The circuit layer DP-CL may include the buffer layer BFL, the first intermediate inorganic layer L10, the second intermediate inorganic layer L20, and the third intermediate inorganic layer L30 and may include the first intermediate organic layer L40 and the second intermediate organic layer L50 as described above.

The dam DAM may include the circuit layer DP-CL, a first layer 1Lb, and a second layer 2Lb. For example, the first layer 1Lb may include the same material as that of the pixel definition layer PDL (refer to FIG. 7B). The second layer 2Lb may include at least one of an organic material and an inorganic material. For example, the second layer 2Lb may be an organic layer. The second layer 2Lb of the dam DAM may be stacked on the first layer 1Lb of the dam DAM to increase the height of the dam DAM.

The division pattern BPG may have a first height H1 smaller than a second height H2 of the dam DAM. In the present disclosure, the height of the division pattern BPG may be measured with respect to an upper surface of the base layer BL and the height of the dam DAM may be measured with respect to the upper surface of the base layer BL.

Referring to FIG. 8B, the division pattern BPG may include the circuit layer DP-CL, a first layer 1La, and a second layer 2La. For example, the first layer 1La may include the same material as that of the pixel definition layer PDL (refer to FIG. 7B). The second layer 2La may include at least one of an organic material and an inorganic material. For example, the second layer 2La may be an organic layer.

In FIG. 8B, the first height H1 of the division pattern BPG may be substantially the same as the second height H2 of the dam DAM.

Referring to FIG. 8C, the division pattern BPG may include the circuit layer DP-CL and a first layer 1La. For example, the first layer 1La may include the same material as that of the pixel definition layer PDL (refer to FIG. 7b).

The dam DAM may include the circuit layer DP-CL and a first layer 1Lb. For example, the first layer 1Lb may include the same material as that of the pixel definition layer PDL (refer to FIG. 7B).

In FIG. 8C, the first height H1 of the division pattern BPG may be substantially the same as the second height H2 of the dam DAM.

However, the embodiments of the present disclosure should not be limited to those shown in FIGS. 8A, 8B, and 8C, and the division pattern BPG and the dam DAM may include various components to have various heights.

According to an embodiment of the present disclosure the display device includes: a display panel DP including a base layer BL, a circuit layer DP-CL, a light emitting element layer (PDL, CPL, etc.), and a hole OP, wherein the hole OP passes through the circuit layer DP-CL and the light emitting element layer (PDL, CPL, etc.); a compensation layer RL disposed on the light emitting element layer (PDL, CPL, etc.) and overlapping the hole OP; and a division pattern BPG disposed around the hole OP when viewed in a plane and including a first division pattern BP1, a second division pattern BP2, and a third division pattern BP3, which are sequentially arranged and spaced apart from each other.

Figure 9:
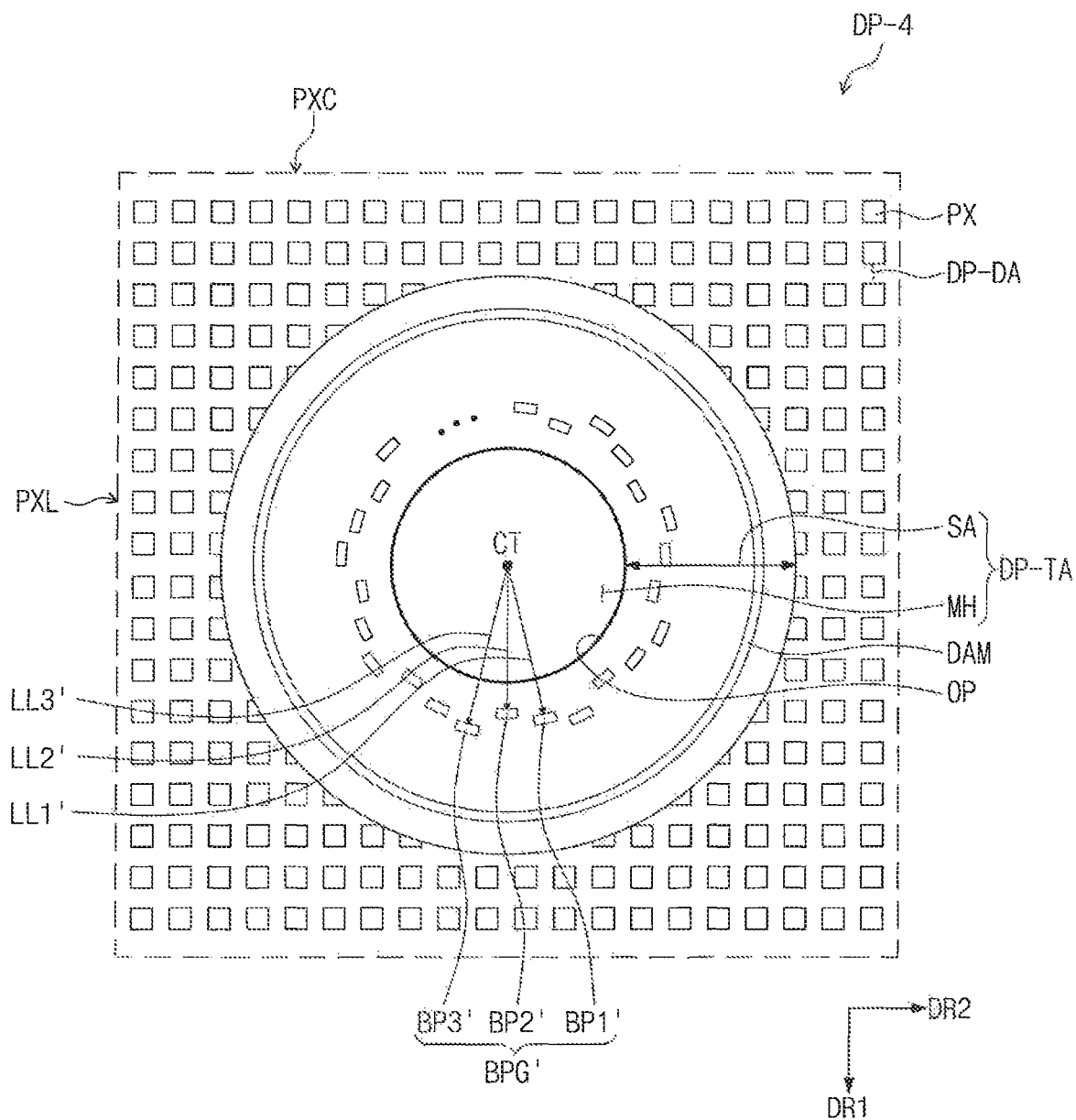
FIG. 9 is an enlarged plan view showing a display panel according to an embodiment of the present disclosure.

FIG. 9 is an enlarged plan view showing a display panel DP-4 according to an embodiment of the present disclosure.

The display panel DP-4 of FIG. 9 may include a division pattern BPG' disposed in a peripheral area SA. The division pattern BPG' may surround a hole OP. The division pattern BPG may include a first division pattern BP1', a second division pattern BP2', and a third division pattern BP3', which are sequentially arranged around the hole OP. The first, second, and third division patterns BP1', BP2', and BP3' may be spaced apart from each other.

A first length LL1' may be a length from a center CT of the hole OP to the first division pattern BP1', a second length LL2' may be a length from the center CT of the hole OP to the second division pattern BP2', and a third length LL3' may be a length from the center CT of the hole OP to the third division pattern BP3'.

In the present embodiment, at least one of the first, second, and third lengths LL1', LL2', and LL3' may be different from the rest of the first, second, and third lengths LL1'. LL2', and LL3'. For example, the first, second, and third lengths LL1', LL2', and LL3' may respectively have different values from each other. As another example, the first and second lengths LL1' and LL2' may have the same length and the third length LL3' may be different from both of the first and second lengths LL1' and LL2'.

As shown in FIG. 9, for example, the first length LL1' may be greater than the second length LL2', and the third length LL3' may be greater than the first length LL1'.

The division pattern BPG' may include the first, second, and third division patterns BP1', BP2', and BP3' that surround the hole OP and are spaced apart from each other, and the length from the center CT of the hole OP to the first, second, and third division patterns BP1', BP2', and BP3' may vary.

Descriptions of elements described with reference to FIGS. 8A to 8C may be applied to the division pattern BPG' and the dam DAM shown in FIG. 9. For example, the division pattern BPG' may have a height equal to or smaller than a height of the dam DAM.

Figure 10A:
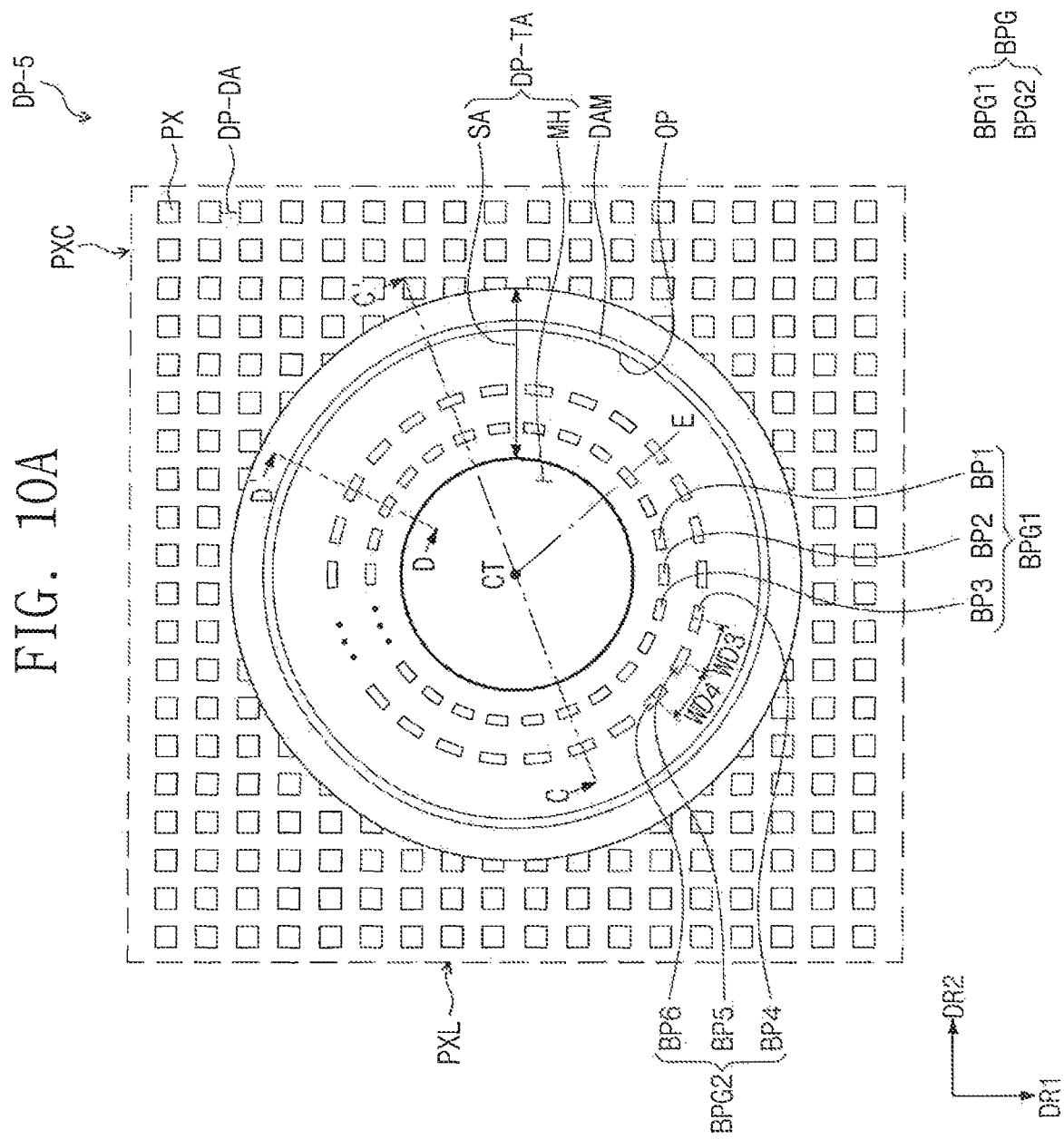
FIGS. 10A and 10B are enlarged plan views showing a display panel according to an embodiment of the present disclosure.
Figure 10B:
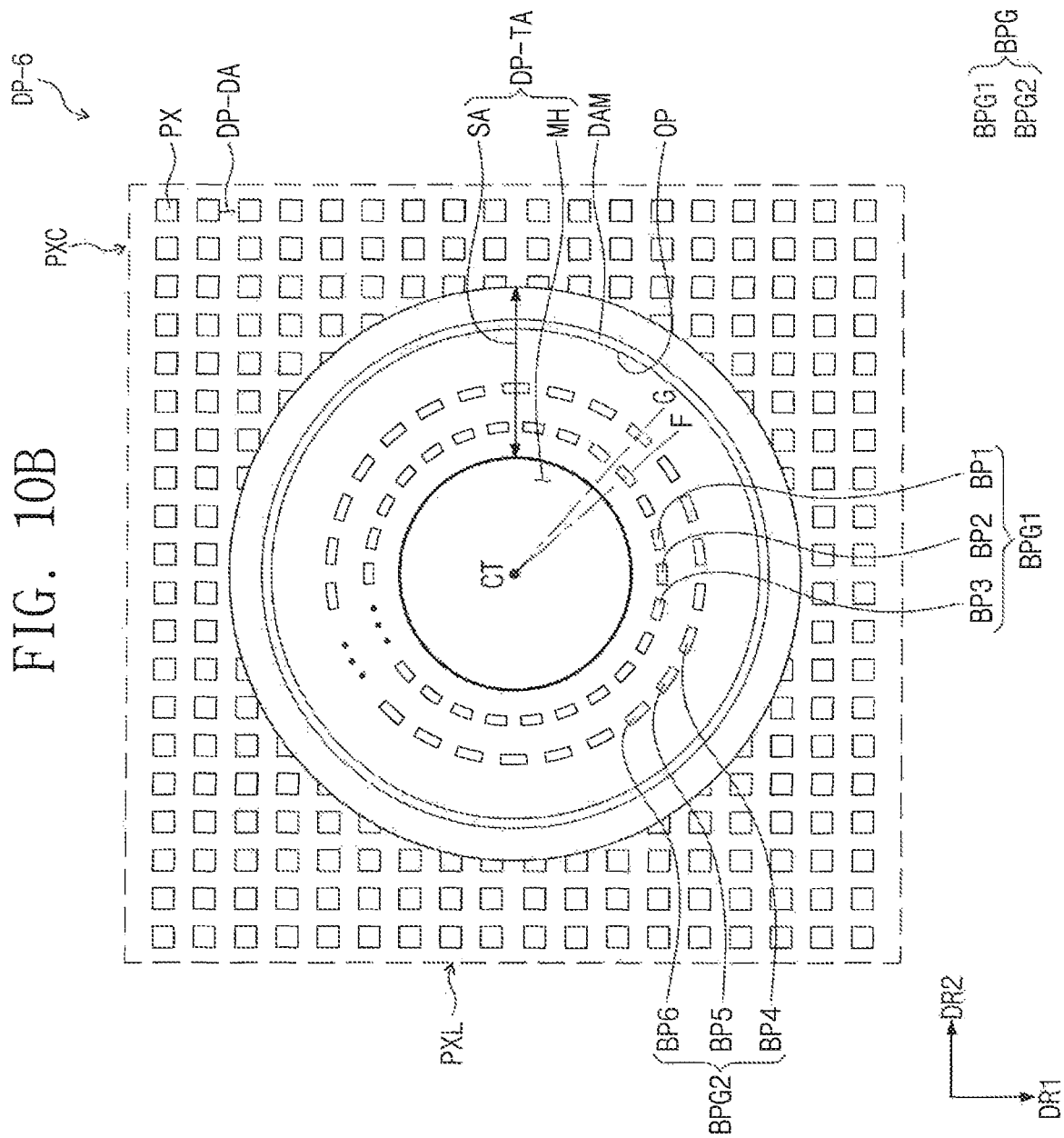
Figure 10C:
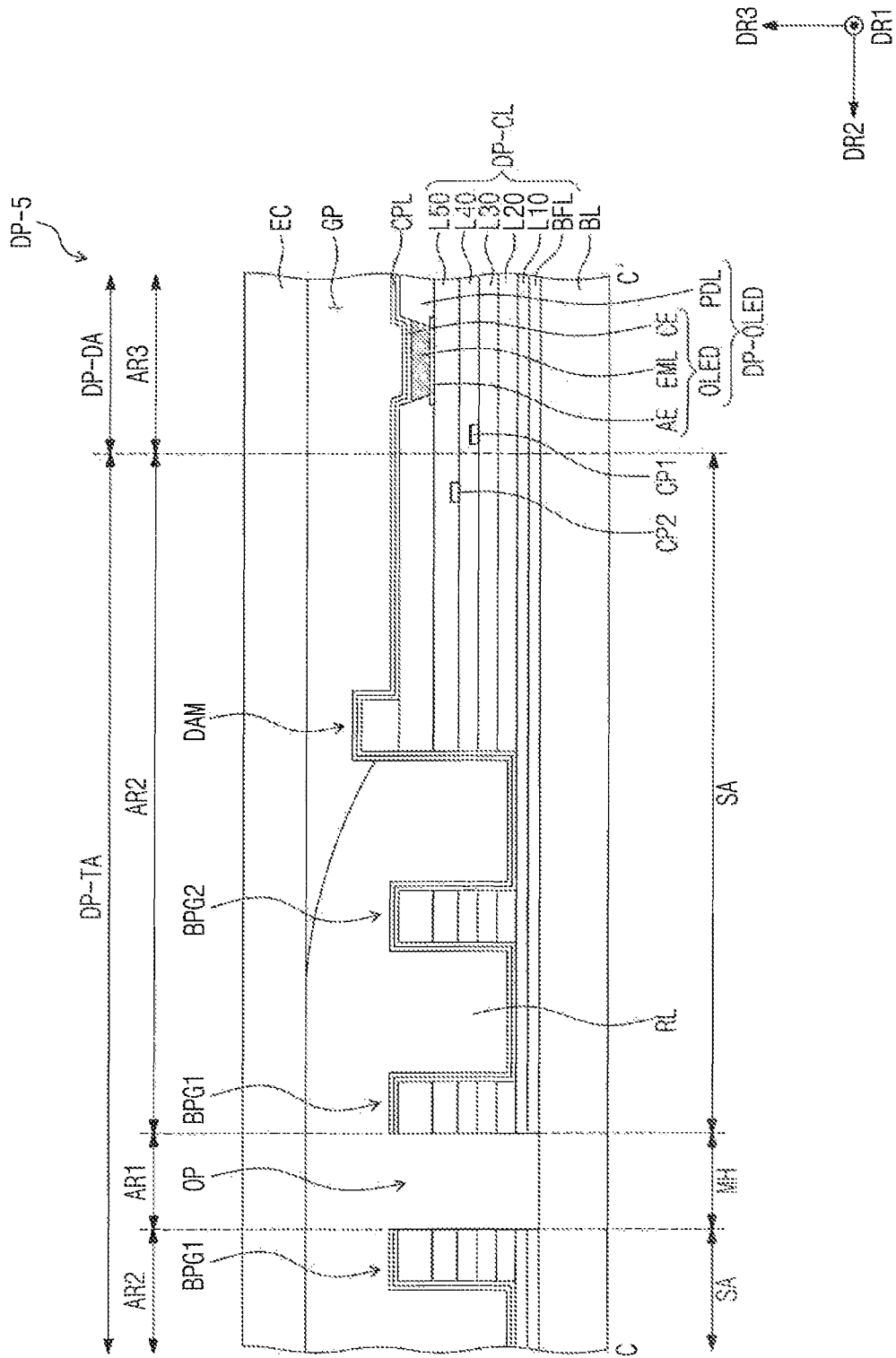
FIG. 10C is a cross-sectional view taken along a line C-C' of FIG. 10A.

FIGS. 10A and 10B are enlarged plan views showing display panels DP-5 and DP-6 according to an embodiment of the present disclosure. FIG. 10C is a cross-sectional view taken along a line C-C' of FIG. 10A.

Referring to FIG. 10A, a division pattern BPG may include a primary division pattern BPG1 disposed adjacent to a hole OP and a secondary division pattern BPG2 disposed between the primary division pattern BPG1 and a dam DAM. Each of the primary division pattern BPG1 and the secondary division pattern BPG2 may surround the hole OP. The division pattern BPG of FIG. 10 is provided along two lines each of which surrounds the hole OP.

The primary division pattern BPG1 may be closer to the center CT of hole OP than the secondary division pattern BPG2 is. The secondary division pattern BPG2 may be closer to the dam DAM than the primary division pattern BPG1 is.

The secondary division pattern BPG2 may be disposed on the same line as the primary division pattern BPG. For example, the primary division pattern BPG1 may be disposed on a line E connecting the secondary division pattern BPG2 to the center CT of the hole OP. For example, a third division pattern BP3 of the primary division pattern BPG1 may be disposed on a line connecting a fourth division pattern BP4 of the secondary division pattern BPG2 to the center CT of the hole OP.

The primary division pattern BPG1 may include a first division pattern BP1, a second division pattern BP2, and the third division pattern BP3 spaced apart from each other as described with reference to FIG. 7A.

The secondary division pattern BPG2 may include the fourth division pattern BP4, a fifth division pattern BP5, and a sixth division pattern BP6, which are sequentially arranged around the hole OP and spaced apart from each other. The secondary division pattern BPG2 may be disposed in a circular shape similar to a shape of the hole OP.

A third distance WD3 that is a separation distance between the fourth division pattern BP4 and the fifth division pattern BP5 may be substantially the same as a fourth distance WD4 that is a separation distance between the fifth division pattern BP5 and the sixth division pattern BP6.

Since the third distance WD3 and the fourth distance WD4 are substantially the same as each other, the fluid filled in the hole OP may not be concentrated at a specific area and may be dispersed at the same speed when the fluid filled in the hole OP passes through the primary and secondary division patterns BPG1 and BPG2 on the second area AR2. In addition, the spaces (or openings) between the first, second, and third division patterns BP1, BP2, and BP3 of the primary division pattern BPG1 may respectively overlap the spaces (or openings) between the fourth, fifth, and sixth division patterns BP4, BP5, and BP6 of the secondary division pattern BPG2.

Descriptions for the first, second, and third division patterns BP1, BP2, and BP3 with reference to FIG. 7A and descriptions for the first, second, and third division patterns BP1', BP2', and BP3' with reference to FIG. 9 may be applied to the fourth, fifth, and sixth division patterns BP4, BP5, and BP6. For example, the fourth, fifth, and sixth division patterns BP4, BP5, and BP6 may be spaced the same distance from the center CT of the hole OP or at least one of the fourth, fifth, and sixth division patterns BP4, BP5, and BP6 may be spaced apart from the center CT of the hole OP by a different distance.

Referring to the display panel DP-6 of FIG. 10B, a primary division pattern BPG1 and a secondary division pattern BPG2 may be arranged alternately with each other.

For example, a line F connecting the primary division pattern BPG1 to the center CT of the hole OP and a line G connecting the secondary division pattern BPG2 to the center CT of the hole OP may be different from each other. For example, the line F may be offset from the ling G. In this case, the primary division pattern BPG1 may not be disposed on the line G connecting the secondary division pattern BPG2 to the center CT of the hole OP. For example, a third division pattern BP3 may not be disposed on a line connecting a fourth division pattern BP4 to the center CT. Therefore, the spaces between the first, second, and third division patterns BP1, BP2, and BP3 of the primary division pattern BPG1 may not coincide with the spaces between the fourth, fifth, and sixth division patterns BP4, BP5, and BP6 of the secondary division pattern BPG2.

Referring to FIG. 10C, the primary division pattern BPG1, the secondary division pattern BPG2, and the dam DAM may be disposed in a peripheral area SA. The peripheral area SA may correspond to the second area AR2.

For example, the secondary division pattern BPG2 may be disposed between the primary division pattern BPG1 and the dam DAM. The secondary division pattern BPG2 may be disposed closer to the first area AR1 in which the hole OP is provided than the dam DAM is.

The secondary division pattern BPG2 may be disposed on the base layer BL and may include a plurality of layers. For example, the secondary division pattern BPG2 may include the same material as the circuit layer DP-CL and the pixel definition layer PDL. The secondary division pattern BPG2 may include the layers formed through the same process as the circuit layer DP-CL and the pixel definition layer PDL, respectively.

The dam DAM may have a height greater than a height of the primary and secondary division patterns BPG1 and BPG2. For example, as described with reference to FIG. 7B, the dam DAM may include a plurality of layers formed through the same process as the circuit layer DP-CL and the pixel definition layer PDL, respectively, and may further include an additional organic layer. Accordingly, the height of the dam DAM may be greater than the height of the primary and secondary division patterns BPG1 and BPG2.

In FIG. 10C, the same reference numerals denote the same elements in FIG. 7B, and thus, detailed descriptions of the same elements will be omitted.

FIGS. 11A, 11B, 11C, and 11D are cross-sectional views taken along a line D-D' of FIG. 10A.

Figure 11A:
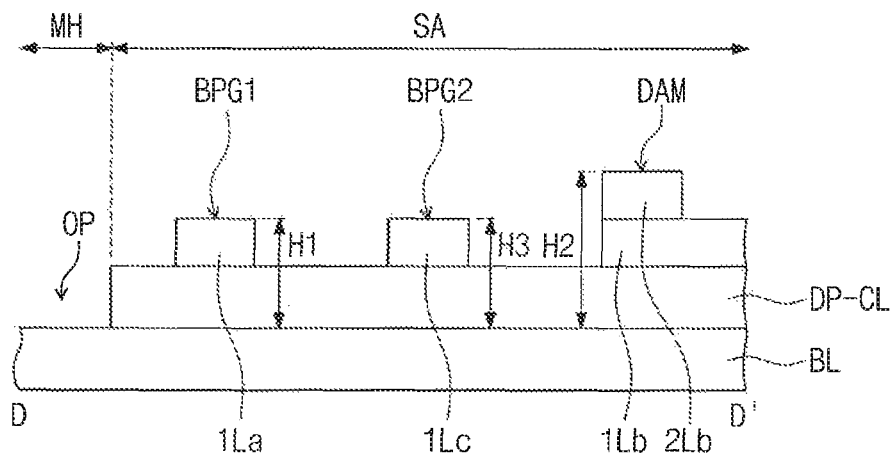
FIGS. 11A, 11B, 11C, and 11D are cross-sectional views taken along a line D-D' of FIG. 10A.

FIG. 11A shows the hole OP, the primary division pattern BPG1, the secondary division pattern BPG2, and the dam DAM. Each of the primary division pattern BPG1, the secondary division pattern BPG2, and the dam DAM may surround the hole OP and may be disposed in a peripheral area SA.

Descriptions on the division pattern BPG and the dam DAM provided with reference to FIG. 8A may be applied to the primary division pattern BPG1 and the dam DAM, respectively.

The secondary division pattern BPG2 may include the circuit layer DP-CL and a first layer 1Lc. For example, the first layer 1Lc may include the same material as that of the pixel definition layer PDL (refer to FIG. 7B).

The primary division pattern BPG1 may have a first height H1 that is substantially the same as a third height H3 of the secondary division pattern BPG2. The first height H1 and the third height H3 may be smaller than a second height H2 of the dam DAM.

Figure 11B:
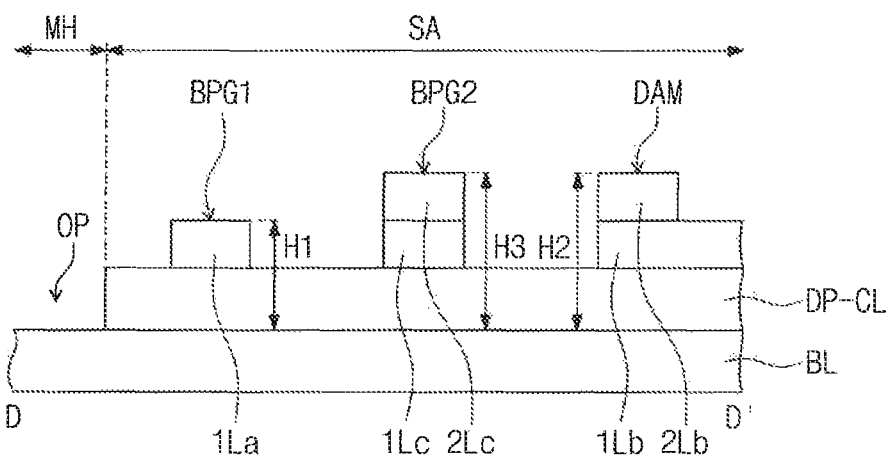

Referring to FIG. 11B, a secondary division pattern BPG2 may include a circuit layer DP-CL, a first layer 1Lc, and a second layer 2Lc. For example, the first layer 1Lc may include the same material as that of the pixel definition layer PDL (refer to FIG. 7B). The second layer 2Lc may include at least one of an organic material and an inorganic material. For example, the second layer 2Lc may be an organic layer.

A primary division pattern BPG1 may have a first height H1 smaller than a third height 143 of the secondary division pattern BPG2. The third height H3 may be adjusted to be the same as a second height H2 of the dam DAM.

Figure 11C:
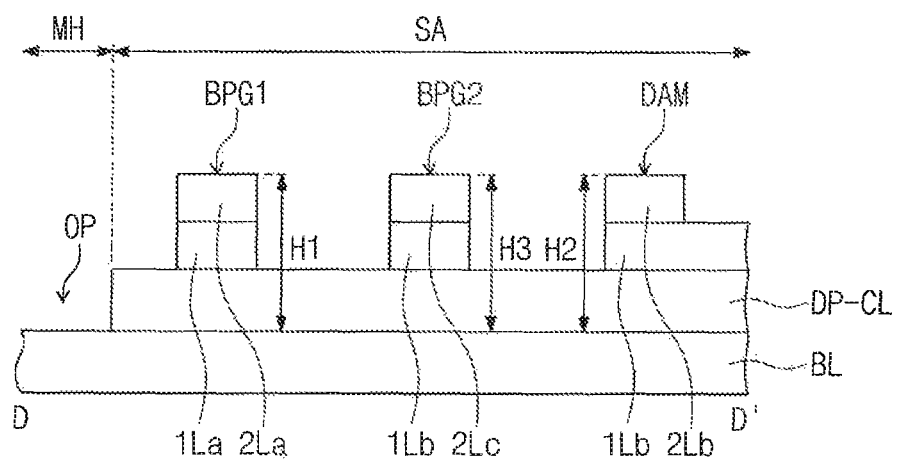

Referring to FIG. 11C, a first height H1, a second height H2, and a third height 143 may be the same as each other. For example, a primary division pattern BPG1 may include a circuit layer DP-CL, a first layer 1La, and a second layer 2La. A secondary division pattern BPG2 may include the circuit layer DP-CL, a first layer 1Lc, and a second layer 2Lc. A dam DAM may include the circuit layer DP-CL, a first layer 1Lb and a second layer 2Lb. The heights of the primary division pattern BPG1, the secondary division pattern BPG2, and the dam DAM may be adjusted to be the same as each other.

Descriptions on the second layer 2La of the division pattern BPG with reference to FIG. 8B may be applied to the second layer 2La of the primary division pattern BPG1.

Figure 11D:
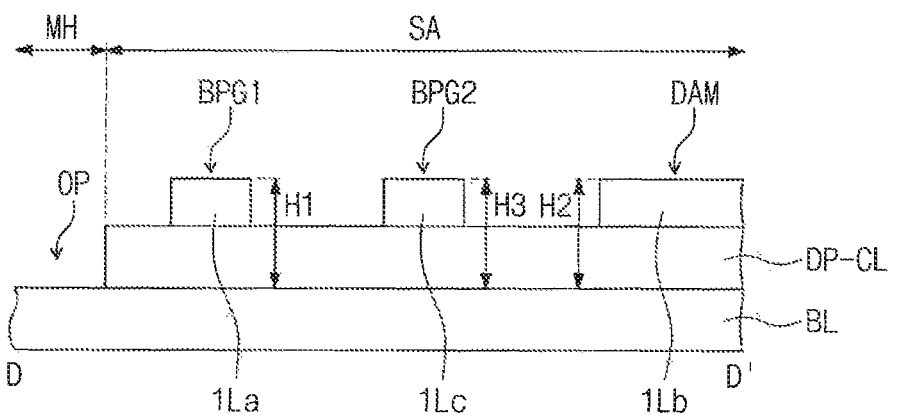

Referring to FIG. 11D, a primary division pattern BPG1 may include a circuit layer DP-CL and a first layer 1La. A secondary division pattern BPG2 may include the circuit layer DP-CL and a first layer 1Lc. A dam DAM may include the circuit layer DP-CL and a first layer 1Lb.

Accordingly, a first height H1, a second height 112, and a third height H3 may be the same as each other.

However, the embodiments of the present disclosure should not be limited to those of FIGS. 11A to 11D, and the primary and secondary division pattern BPG1 and BPG2 and the dam DAM may have various structures, and thus, may have various heights.

Figure 12:
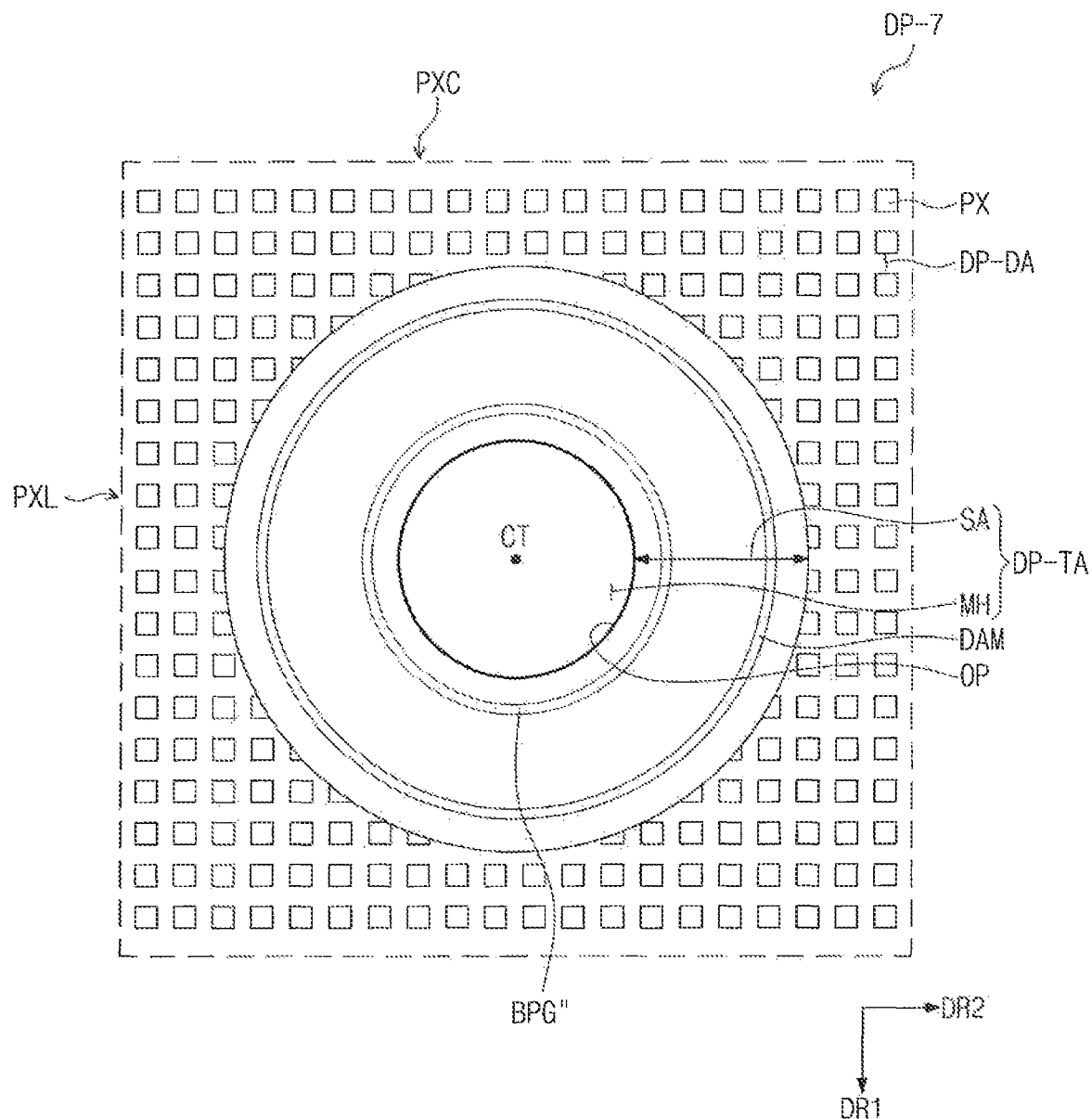
FIG. 12 is an enlarged plan view showing a display panel according to an embodiment of the present disclosure.

FIG. 12 is an enlarged plan view showing a display panel DP-7 according to an embodiment of the present disclosure.

A division pattern BPG" may have a closed curve shape. In other words, the division pattern BPG" may have a single body shape obtained by connecting the first to n-th division patterns BP1 to BPn shown in FIG. 7A to each other.

In addition, descriptions with reference to FIGS. 7B to 7D may be equally applied to the shape and the structure of the division pattern BPG" and the dam DAM. Further, descriptions with reference to FIGS. 8A to 8D may be equally applied to the heights of the division pattern BPG" and the dam DAM.

Figure 13:
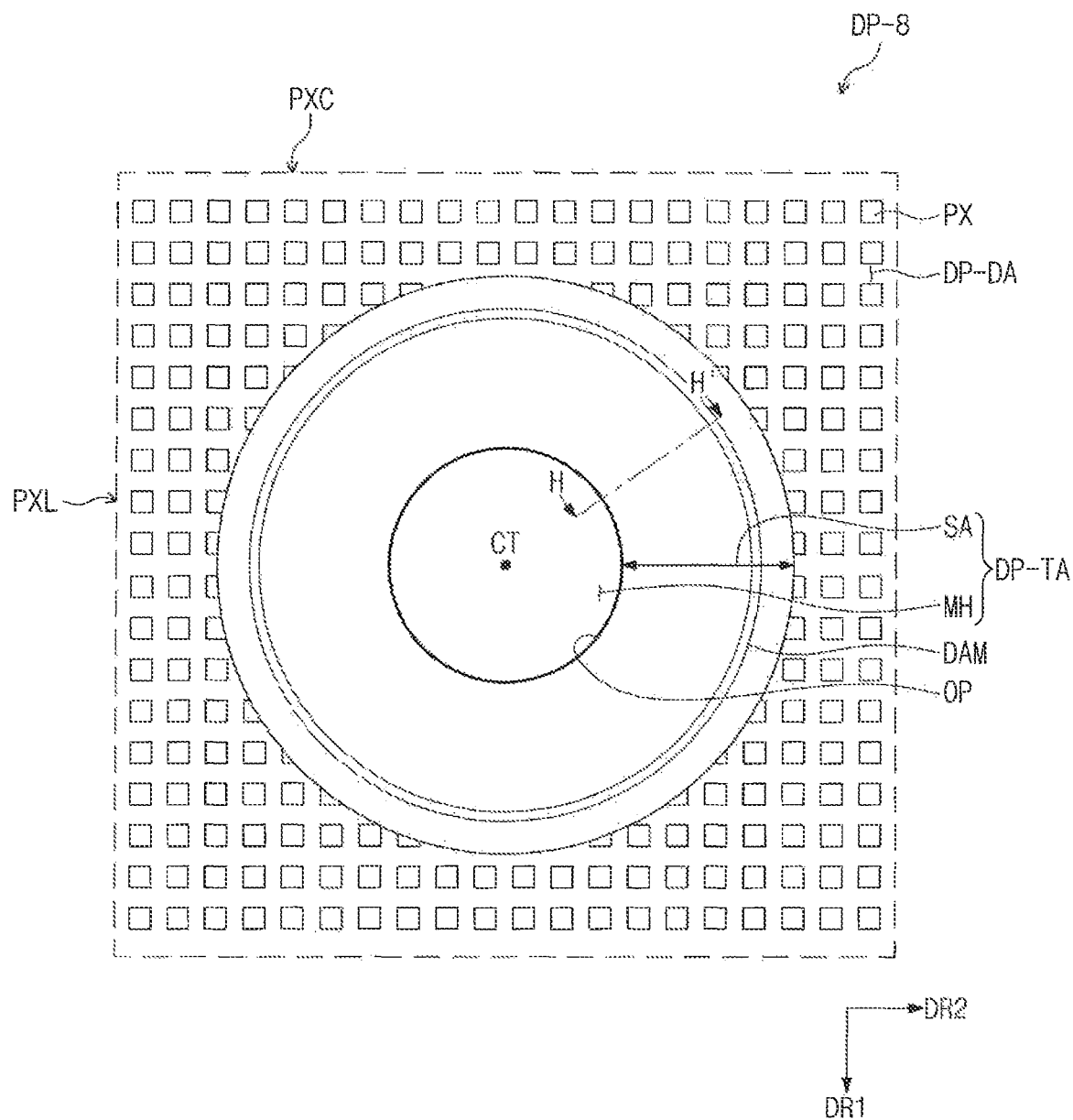
FIG. 13 is an enlarged plan view showing a display panel according to an embodiment of the present disclosure.
Figure 14:
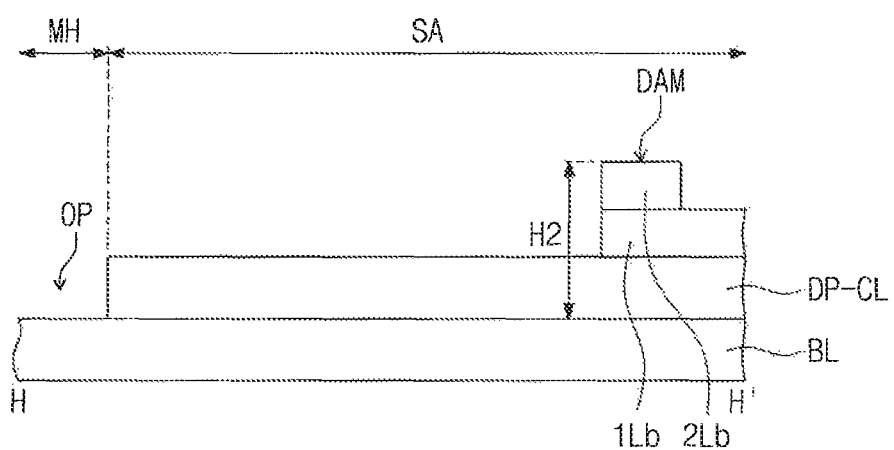
FIG. 14 is a cross-sectional view taken along a line H-H' of FIG. 13.

FIG. 13 is an enlarged plan view showing a display panel DP-8 according to an embodiment of the present disclosure. FIG. 14 is a cross-sectional views taken along a line H-H' of FIG. 13.

Referring to FIG. 13, a division pattern may be omitted from the display panel DP-8. In other words, only a dam DAM may be disposed in the second non-active area DP-TA. Descriptions on the dam DAM with reference with FIGS. 7B to 7D may be equally applied to the dam DAM shown in FIG. 13. In other words, the dam DAM according to the present embodiment may include a plurality of layers formed through the same process as a circuit layer DP-CL and a pixel definition layer PDL, respectively, and may further include an additional organic layer. In addition, the dam DAM may be spaced apart from the encapsulation substrate EC in the third direction DR3.

Hereinafter, embodiments of the present disclosure will be described in detail. However, the display device of the present disclosure should not be limited thereto or thereby.

Evaluation of dispersion of filler Table 1 shows the time (s) taken for the filler to reach a dam after the filler is filled in a hole.

Embodiment example 1 is a display device in which a division pattern is disposed between the hole and the dam. For example, embodiment example 1 may be the display device in which the division pattern and the dam are disposed in the peripheral area SA of the present disclosure. In embodiment example 1, a height of the division pattern and a height of the dam are set to be the same as each other. For example, the division pattern and the dam may have substantially the same structure and configuration as those of the division pattern and the dam shown in FIGS. 7A and 8B. The division pattern may include the circuit layer DP-CL, the first layer 1La, and the second layer 2La, and the dam may include the circuit layer DP-CL, the first layer 1Lb, and the second layer 2Lb.

Embodiment example 2 is a display device in which a division pattern is disposed between a hole and a dam. For example, embodiment example 2 may be the display device in which the division pattern and the dam are disposed in the peripheral area SA of the present disclosure. In embodiment example 2, a height of the division pattern is set to be smaller than a height of the dam. For example, the division pattern and the dam may have substantially the same structure and configuration as those of the division pattern and the dam shown in FIGS. 7A and 8A. The division pattern may include the circuit layer DP-CL and the first layer 1La, and the dam may include the circuit layer DP-CL, the first layer 1Lb, and the second layer 2Lb.

Embodiment example 3 is a display device in which a plurality of division patterns is disposed between a hole and a dam. For example, embodiment example 3 may be the display device in which the division patterns and the dam are disposed in the peripheral area SA of the present disclosure. In embodiment example 3, a height of the division patterns and a height of the dam are set to be the same as each other. For example, the division patterns and the dam may have substantially the same structure as those of the division patterns and the dam shown in FIGS. 10A and 11C. Each of the division patterns may include the circuit layer, the first layer and the second layer, and the dam may include the circuit layer DP-CL, the first layer 1Lb, and the second layer 2Lb. FIG. 11C shows the structure in which the division pattern BPG includes two division patterns, e.g., the primary division pattern BPG1 and the secondary division pattern BPG2, however, the display device of embodiment example 3 may include three or more division patterns.

Embodiment example 4 is a display device in which a division pattern is not disposed between a hole and a dam. For example, embodiment example 4 may be the display device in which only the dam is disposed in the peripheral area SA of the present disclosure. The dam of embodiment example 4 may have the structure shown in FIGS. 13 and 14. For example, the dam may include the circuit layer DP-CL, the first layer 1Lb, and the second layer 2Lb.

TABLE 1

|  | Time (s) |
| --- | --- |
| Embodiment example 1 | 18.328 |
| Embodiment example 2 | 16.277 |
| Embodiment example 3 | 14.464 |
| Embodiment example 4 | 14.272 |

Referring to the results of embodiment examples 1 to 3, a dispersion speed of the filler is controlled while the filler passes through the division pattern. For example, it is observed that the dispersion speed of the filler is constantly controlled since the division pattern of embodiment examples 1 to 3 includes the first to third division patterns arranged to surround the hole and to be spaced apart from each other. In the case of embodiment example 4, since the division pattern is not disposed between the hole and the dam, the time (s) measured (e.g., 14.272 s) is the shortest among embodiment examples 1 to 4.

The display device DD of the present disclosure may include the division pattern BPG including the first division pattern BP1, the second division pattern BP2, and the third division pattern BP3 sequentially arranged around the hole OP, and thus, may control the compensation layer RL not to overflow to the active area DP-DA. Accordingly, the pixel PX may be prevented from being defective due to the compensation layer RL overflowing to the active area DP-DA, and thus, a defective rate of the display device DD may be reduced. The present disclosure further provides a display device having a relatively wider display area and a relatively narrower non-display area.

Although embodiments of the present disclosure have been described, it is understood that the present disclosure should not be limited to these embodiments but various changes and modifications can be made thereto by one of ordinary skill in the art.

What is claimed is:

1. A display device, comprising:
a display panel comprising a base layer, a circuit layer, a light emitting element layer, and a hole, wherein the hole passes through the circuit layer and the light emitting element layer;
a layer disposed on the light emitting element layer and filling the hole;
a pattern disposed around the hole when viewed in a plane and comprising a first pattern, a second pattern, and a third pattern, which are sequentially arranged and spaced apart from each other; and
an encapsulation substrate disposed on the layer,
wherein the layer comprises:
a first portion overlapping with each of the first pattern, the second pattern, and the third pattern and in direct contact with the encapsulation substrate, and
a second portion extending from the first portion, wherein a gap is provided between the second portion and the encapsulation substrate, wherein the gap is in a vacuum state.

2. The display device of claim 1, wherein a distance between the first pattern and the second pattern is substantially the same as a distance between the second pattern and the third pattern.

3. The display device of claim 1, wherein the pattern is disposed on the base layer.

4. The display device of claim 1, wherein the light emitting element layer comprises:
a pixel definition layer disposed on the circuit layer;
a first electrode exposed through the pixel definition layer;
a light emitting layer disposed on the first electrode; and
a second electrode disposed on the light emitting layer, wherein the pattern comprises a same material as the pixel definition layer.

5. The display device of claim 1, wherein the pattern comprises a plurality of layers.

6. The display device of claim 1, wherein a first length from a center of the hole to the first pattern, a second length from the center of the hole to the second pattern, and a third length from the center of the hole to the third pattern are substantially the same as each other.

7. The display device of claim 1, wherein a first length from a center of the hole to the first pattern is different from a second length from the center of the hole to the second pattern.

8. The display device of claim 1, further comprising a dam surrounding the hole and disposed on the base layer.

9. The display device of claim 8, wherein a distance from the pattern to a center of the hole is less than a distance from the dam to the center of the hole.

10. The display device of claim 8, wherein the dam comprises a plurality of layers.

11. The display device of claim 8, wherein the dam has a height greater than a height of the pattern.

12. The display device of claim 8, wherein the pattern further comprises:
   a primary pattern disposed adjacent to the hole; and
   a secondary pattern disposed between the primary pattern and the dam, wherein the secondary pattern comprises a fourth pattern, a fifth pattern, and a sixth pattern, which are arranged around the hole and spaced apart from each other.

13. The display device of claim 12, wherein a distance between the fourth pattern and the fifth pattern is substantially the same as a distance between the fifth pattern and the sixth pattern.

14. The display device of claim 1, wherein the display panel comprises an active area for displaying an image and a non-active area adjacent to the active area, wherein the hole is surrounded by the active area.

\* \* \* \* \*